United States Patent
Kim et al.

(10) Patent No.: US 11,329,066 B2
(45) Date of Patent: May 10, 2022

(54) SEMICONDUCTOR DEVICES HAVING MULTI-CHANNEL ACTIVE REGIONS AND METHODS OF FORMING SAME

(71) Applicant: Samsung Electronics Co., Ltd., Suwon-si (KR)

(72) Inventors: Munhyeon Kim, Hwaseong-si (KR); Soonmoon Jung, Seongnam-si (KR); Daewon Ha, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/201,494

(22) Filed: Mar. 15, 2021

(65) Prior Publication Data
US 2022/0045103 A1 Feb. 10, 2022

(30) Foreign Application Priority Data
Aug. 4, 2020 (KR) .................. 10-2020-0097389

(51) Int. Cl.
| | |
|---|---|
| *H01L 27/12* | (2006.01) |
| *H01L 29/08* | (2006.01) |
| *H01L 21/84* | (2006.01) |
| *H01L 29/423* | (2006.01) |
| *H01L 29/10* | (2006.01) |

(52) U.S. Cl.
CPC .......... *H01L 27/1203* (2013.01); *H01L 21/84* (2013.01); *H01L 29/0847* (2013.01); *H01L 29/1033* (2013.01); *H01L 29/42356* (2013.01); *H01L 29/42368* (2013.01)

(58) Field of Classification Search
CPC . H01L 27/1203; H01L 21/84; H01L 29/0847; H01L 29/1033; H01L 29/42356; H01L 29/42368
USPC ................................. 257/351; 438/153, 154
See application file for complete search history.

(56) References Cited

U.S. PATENT DOCUMENTS

| | | | |
|---|---|---|---|
| 8,987,794 B2 | 3/2015 | Rachmady et al. | |
| 9,660,028 B1 * | 5/2017 | Cheng et al. | ....... H01L 29/0673 |
| 9,876,015 B1 | 1/2018 | Balakrishnan et al. | |
| 10,141,403 B1 | 11/2018 | Cheng et al. | |
| 10,332,803 B1 | 6/2019 | Xie et al. | |
| 10,396,169 B2 | 8/2019 | Cheng et al. | |

(Continued)

*Primary Examiner* — Thinh T Nguyen
(74) *Attorney, Agent, or Firm* — Myers Bigel, P.A.

(57) ABSTRACT

A multi-channel semiconductor-on-insulator (SOI) transistor includes a substrate having an electrically insulating layer thereon and a semiconductor active layer on the electrically insulating layer. A vertical stack of spaced-apart insulated gate electrodes, which are buried within the semiconductor active layer, is also provided. This vertical stack includes a first insulated gate electrode extending adjacent the electrically insulating layer and an (N–1)th insulated gate electrode that is spaced from a surface of the semiconductor active layer, where N is a positive integer greater than two. An Nth insulated gate electrode is provided on the surface of the semiconductor active layer. A pair of source/drain regions are provided within the semiconductor active layer. These source/drain regions extend adjacent opposing sides of the vertical stack of spaced-apart insulated gate electrodes. In some of these aspects, the semiconductor active layer extends between the pair of source/drain regions and the electrically insulating layer, whereas the first insulated gate electrode contacts the electrically insulating layer.

20 Claims, 33 Drawing Sheets

(56) References Cited

U.S. PATENT DOCUMENTS

| | | |
|---|---|---|
| 10,418,487 B2 | 9/2019 | Rachmady et al. |
| 2019/0051729 A1 | 2/2019 | Zhou |
| 2020/0035820 A1 | 1/2020 | Zhang et al. |
| 2020/0083219 A1 | 3/2020 | Kang et al. |
| 2020/0358203 A1 | 11/2020 | Park et al. |

* cited by examiner

SEMICONDUCTOR DEVICES HAVING MULTI-CHANNEL ACTIVE REGIONS AND METHODS OF FORMING SAME

REFERENCE TO PRIORITY APPLICATION

This U.S. non-provisional patent application claims priority under 35 U.S.C. § 119 to Korean Patent Application No. 10-2020-0097389, filed Aug. 4, 2020, the disclosure of which is hereby incorporated herein by reference.

BACKGROUND

Embodiments of the inventive concepts relate to semiconductor devices and methods of forming same and, more particularly, to field effect transistors and methods of forming field effect transistors.

Semiconductor devices may include integrated circuits including metal-oxide-semiconductor field effect transistors (MOSFETs), including complementary metal-oxide-semiconductor (CMOS) field effect transistors (FETs). As the sizes and design rules of semiconductor devices have been reduced, the layout size (e.g., footprint) of MOSFETs have been scaled down as well. Unfortunately, many operating characteristics of semiconductor devices may be deteriorated by the reduction in size of MOSFETs. Accordingly, various methods for forming semiconductor devices have been developed to achieve excellent performance while overcoming man of the limitations associated with high integration.

SUMMARY

Embodiments of the inventive concepts may provide semiconductor devices with improved reliability and electrical characteristics.

In an aspect, a semiconductor device may include a support substrate, an insulating layer on the support substrate, a semiconductor pattern on the insulating layer (with the semiconductor pattern being in contact with the insulating layer) and a pair of source/drain patterns on the semiconductor pattern. A channel structure is also provided, which is disposed between the pair of source/drain patterns. The channel structure includes channel patterns stacked and spaced apart from each other. A gate electrode is also provided, which intersects the channel structure and extends in a first direction. The gate electrode may include a first portion disposed between the channel structure and the insulating layer, and a level of a bottom surface of the first portion may be lower than levels of bottommost surfaces of the source/drain patterns.

In another aspect, a semiconductor device may include a support substrate, an insulating layer on the support substrate, and a semiconductor pattern, which is provided on the insulating layer and is in contact with the insulating layer. A pair of source/drain patterns is provided on the semiconductor pattern, and a channel structure is provided, which is disposed between the pair of source/drain patterns. The channel structure includes at least one channel pattern. A gate electrode is provided, which intersects the channel structure and extends in a first direction. The gate electrode may include one portion disposed between the insulating layer and a lowermost portion of the channel structure, and the one portion may penetrate the semiconductor pattern. A lower portion of the source/drain pattern may be located in the semiconductor pattern. The source/drain pattern may be spaced apart from the insulating layer with the semiconductor pattern interposed therebetween.

In a further aspect, a semiconductor device may include a support substrate, an insulating layer on the support substrate, and a first semiconductor pattern and a second semiconductor pattern, which are provided on the insulating layer and include a PMOSFET region and an NMOSFET region adjacent to each other in a first direction, respectively. A pair of first source/drain patterns are provided on the first semiconductor pattern, and a pair of second source/drain patterns are provided on the second semiconductor pattern. A first channel structure is provided between the pair of first source/drain patterns, and a second channel structure is provided between the pair of second source/drain patterns. And, each of the first and second channel structures includes a first channel pattern, a second channel pattern and a third channel pattern, which are sequentially stacked and are spaced apart from each other. In addition, a first gate electrode and a second gate electrode are provided, which extend in the first direction and intersect the first and second channel structures, respectively. Each of the first and second gate electrodes includes a first portion between the insulating layer and the first channel pattern, a second portion between the first channel pattern and the second channel pattern, a third portion between the second channel pattern and the third channel pattern, and a fourth portion on the third channel pattern. A first gate insulating layer and a second gate insulating layer are provided, which are disposed between the first channel structure and the first gate electrode and between the second channel structure and the second gate electrode, respectively. A first gate spacer and a second gate spacer are provided on sidewalls of the first and second gate electrodes, respectively. A first gate capping pattern and a second gate capping pattern are provided on top surfaces of the first and second gate electrodes, respectively. A first interlayer insulating layer is provided on the first and second gate capping patterns. And, source/drain contacts are provided, which penetrate the first interlayer insulating layer so as to be connected to the first and second source/drain patterns. In addition, gate contacts penetrate the first interlayer insulating layer and the first and second gate capping patterns so as to be connected to the first and second gate electrodes, respectively. A second interlayer insulating layer is provided on the first interlayer insulating layer, and a first metal layer is provided in the second interlayer insulating layer. The first metal layer includes first interconnection lines electrically connected to the source/drain contacts and the gate contacts. The first interconnection lines extend in parallel to each other in a second direction intersecting the first direction. A third interlayer insulating layer is provided on the second interlayer insulating layer. A second metal layer is provided in the third interlayer insulating layer. The second metal layer may include second interconnection lines, which are electrically connected to the first interconnection lines, and the second interconnection lines may extend in the first direction in parallel to each other. The first portion of the first gate electrode may penetrate the first semiconductor pattern, and the first portion of the second gate electrode may penetrate the second semiconductor pattern. The first source/drain pattern may penetrate an upper portion of the first semiconductor pattern, and the second source/drain pattern may penetrate an upper portion of the second semiconductor pattern.

In still further aspects, a multi-channel semiconductor-on-insulator (SOI) transistor is provided, which includes a substrate having an electrically insulating layer thereon and a semiconductor active layer on the electrically insulating layer. A vertical stack of spaced-apart insulated gate electrodes, which are buried within the semiconductor active layer, is also provided. This vertical stack includes a first insulated gate electrode extending adjacent the electrically insulating layer and an (N−1)th insulated gate electrode that is spaced from a surface of the semiconductor active layer, where N is a positive integer greater than two. An Nth insulated gate electrode is also provided on the surface of the semiconductor active layer. A pair of source/drain regions are provided within the semiconductor active layer. These source/drain regions extend adjacent opposing sides of the vertical stack of spaced-apart insulated gate electrodes. In some of these aspects, the semiconductor active layer extends between the pair of source/drain regions and the electrically insulating layer, whereas the first insulated gate electrode contacts the electrically insulating layer.

BRIEF DESCRIPTION OF THE DRAWINGS

The inventive concepts will become more apparent in view of the attached drawings and accompanying detailed description.

FIGS. 6A to 14C are cross-sectional views illustrating a method of manufacturing a semiconductor device, according to some embodiments of the inventive concepts.

FIGS. 6A, 7A, 8A, 9A, 10A, 11A, 12A, 13A and 14A are cross-sectional views corresponding to the line A-A' of FIG. 1.

FIGS. 6C, 7C, 8C, 9B, 12D, 13C and 14C are cross-sectional views corresponding to the line D-D' of FIG. 1.

DETAILED DESCRIPTION OF THE EMBODIMENTS

Figure 1:
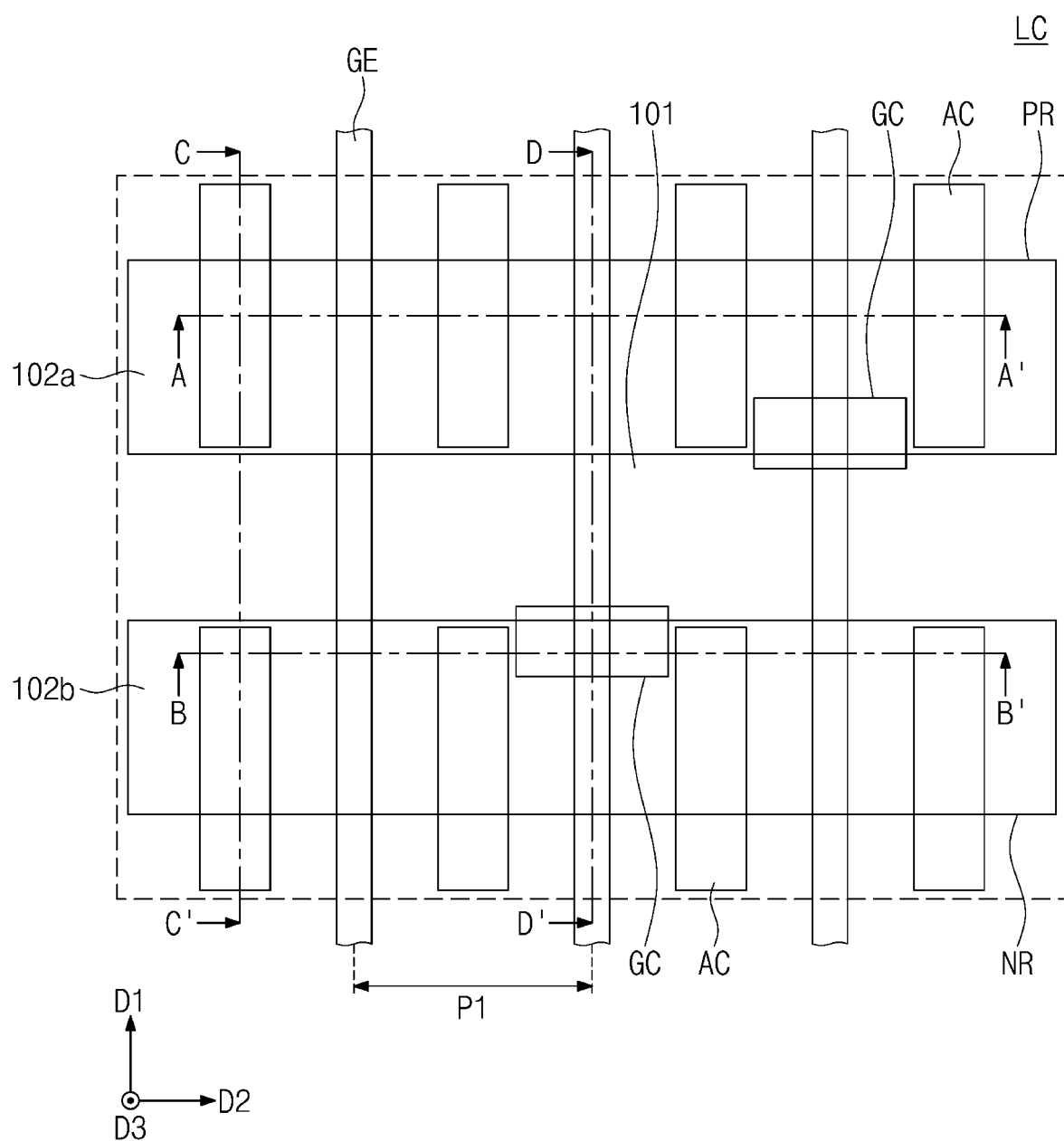
FIG. 1 is a plan view illustrating a semiconductor device according to some embodiments of the inventive concepts.

FIG. 1 is a plan view illustrating a semiconductor device according to some embodiments of the inventive concepts, and FIGS. 2A, 2B, 2C and 2D are cross-sectional views taken along lines A-A', B-B', C-C' and D-D' of FIG. 1, respectively. In FIG. 1, some components are omitted to clearly show the illustrated components.

Referring to FIGS. 1 and 2A to 2D, a semiconductor device may include a support substrate 100, an insulating layer 101 on the support substrate 100, and a first semiconductor pattern 102a and a second semiconductor pattern 102b on the insulating layer 101. A portion of a top surface of the insulating layer 101 may be exposed by the first semiconductor pattern 102a and the second semiconductor pattern 102b.

The support substrate 100 may be a semiconductor substrate including silicon or a compound semiconductor substrate. For example, the support substrate 100 may be a silicon substrate. The insulating layer may be, for example, a silicon oxide layer. Each of the first and second semiconductor patterns 102a and 102b may be, for example, a silicon layer. The support substrate 100, the insulating layer 101 and the first and second semiconductor patterns 102a and 102b may be portions of a silicon-on-insulator (SOI) substrate. The top surface of the insulating layer 101 may be exposed by the first semiconductor pattern 102a and the second semiconductor pattern 102b. The first semiconductor pattern 102a and the second semiconductor pattern 102b may be spaced apart from each other in a first direction D1 with the exposed top surface of the insulating layer 101 interposed therebetween.

A logic cell LC may be provided on the first semiconductor pattern 102a, the second semiconductor pattern 102b, and the insulating layer 101. Logic transistors for constituting a logic circuit may be disposed in the logic cell LC. The logic cell LC may include a PMOSFET region PR and an NMOSFET region NR. The PMOSFET region PR may be defined on the first semiconductor pattern 102a, and the NMOSFET region NR may be defined on the second semiconductor pattern 102b.

Figure 2A:
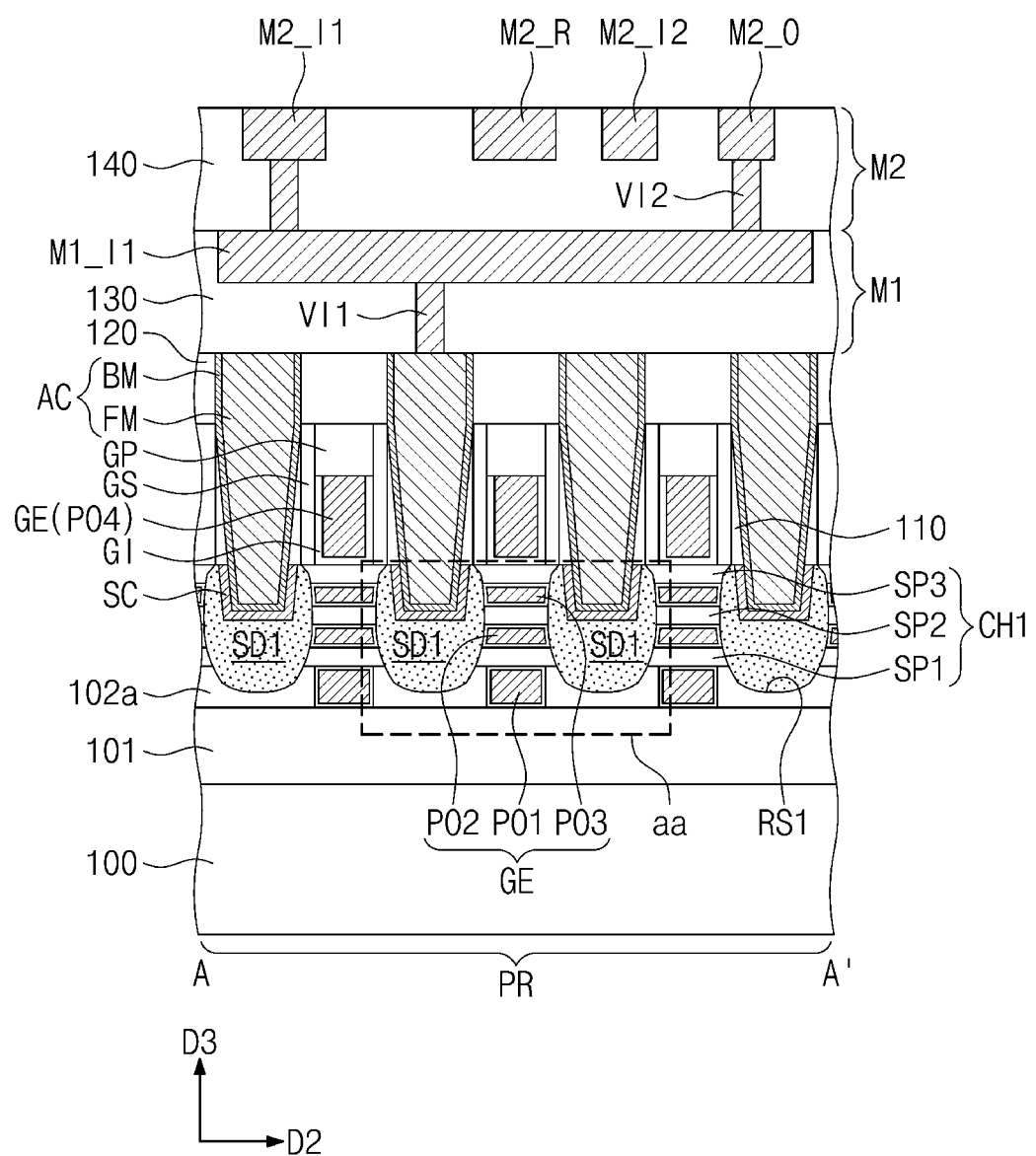
FIGS. 2A, 2B, 2C and 2D are cross-sectional views taken along lines A-A', B-B', C-C' and D-D' of FIG. 1, respectively.
Figure 2B:
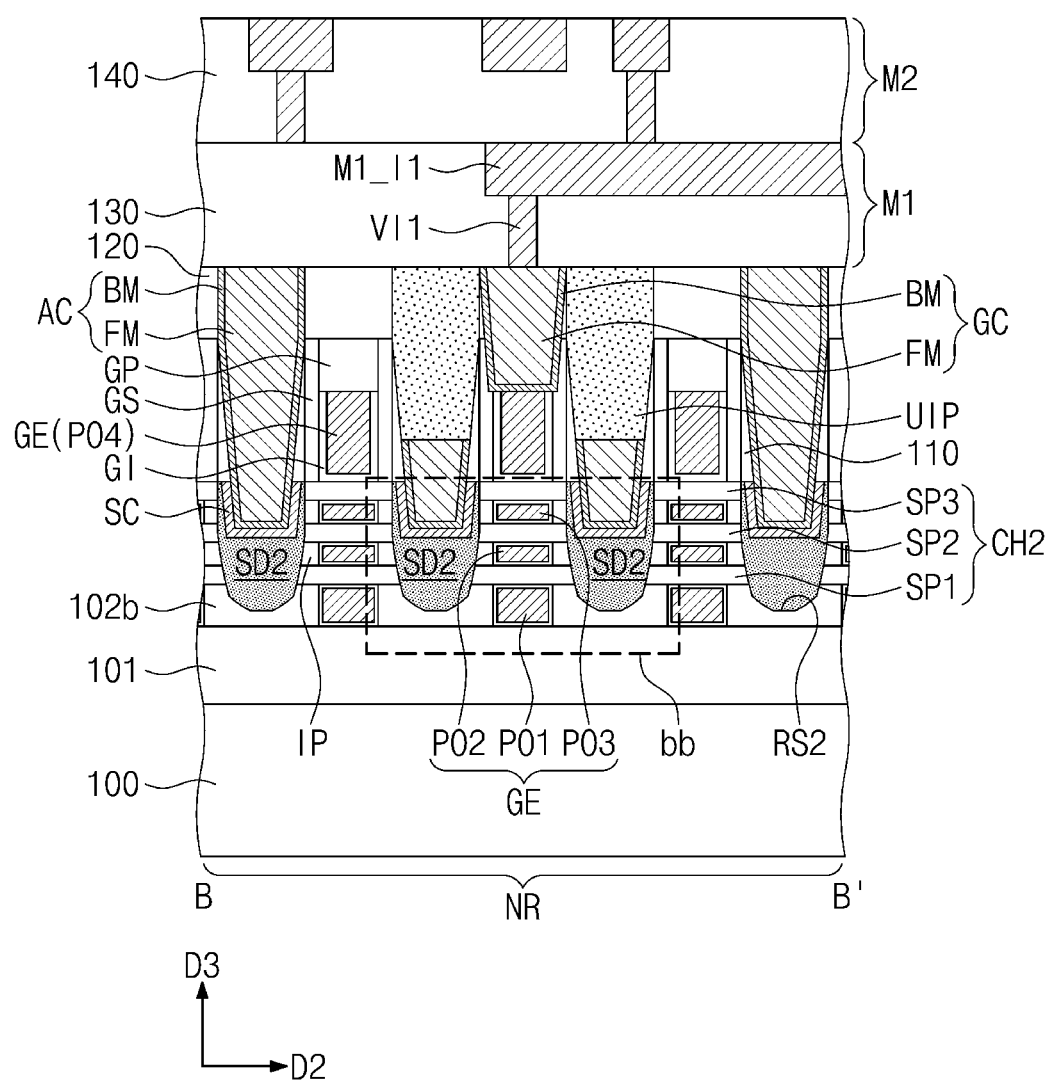

In FIG. 2A, a first channel structure CH1 may be provided on the first semiconductor pattern 102a. In FIG. 2B, a second channel structure CH2 may be provided on the second semiconductor pattern 102b. Each of the first and second channel structures CH1 and CH2 may include a first channel pattern SP1, a second channel pattern SP2 and a third channel pattern SP3, which are sequentially stacked. The first to third channel patterns SP1, SP2 and SP3 may be spaced apart from each other in a vertical direction (i.e., a third direction D3). Each of the first to third channel patterns SP1, SP2 and SP3 may include, for example, silicon (Si).

In FIG. 2A, a plurality of first recesses RS1 may be provided in an upper portion of the first semiconductor pattern 102a. First source/drain patterns SD1 may be provided in the first recesses RS1, respectively. The first source/drain patterns SD1 may be dopant regions having a first conductivity type (e.g., a P-type). The first channel structure CH1 may be disposed between a pair of the first source/drain patterns SD1. The first to third channel patterns SP1, SP2 and SP3 of the first channel structure CH1 may electrically connect the pair of first source/drain patterns SD1 to each other.

In FIG. 2B, a plurality of second recesses RS2 may be provided in an upper portion of the second semiconductor pattern 102b. Second source/drain patterns SD2 may be provided in the second recesses RS2, respectively. The second source/drain patterns SD2 may be dopant regions having a second conductivity type (e.g., an N-type). The second channel structure CH2 may be disposed between a pair of the second source/drain patterns SD2. The first to third channel patterns SP1, SP2 and SP3 of the second channel structure CH2 may electrically connect the pair of second source/drain patterns SD2 to each other.

In some embodiments, a top surface of each of the first and second source/drain patterns SD1 and SD2 may be disposed at substantially the same level as a top surface of the third channel pattern SP3. In certain embodiments, the top surface of each of the first and second source/drain patterns SD1 and SD2 may be higher than the top surface of the third channel pattern SP3.

The first source/drain patterns SD1 may include a semiconductor element (e.g., SiGe) of which a lattice constant is greater than that of a semiconductor element of the first semiconductor pattern 102a. Thus, the pair of first source/drain patterns SD1 may provide compressive stresses to the first channel structure CH1 therebetween to thereby improve device performance.

For example, each of the first source/drain patterns SD1 may include a low-concentration silicon-germanium (SiGe) layer covering an inner surface of the first recess RS1, and a high-concentration silicon-germanium (SiGe) layer covering the low-concentration silicon-germanium (SiGe) layer. A ratio of a volume of the high-concentration silicon-germanium layer to a total volume of the first source/drain pattern SD1 may be greater than a ratio of a volume of the low-concentration silicon-germanium layer to the total volume of the first source/drain pattern SD1. In contrast, the second source/drain patterns SD2 may include the same semiconductor element (e.g., silicon) as the second semiconductor pattern 102b.

Gate electrodes GE may intersect the first and second semiconductor patterns 102a and 102b and may extend in the first direction D1. The gate electrodes GE may be arranged at a first pitch P1 in a second direction D2. Each of the gate electrodes GE may vertically overlap with the first and second channel structures CH1 and CH2. As shown, the gate electrode GE may include a first portion PO1 disposed between the insulating layer 101 and the first channel pattern SP1, a second portion PO2 disposed between the first channel pattern SP1 and the second channel pattern SP2, a third portion PO3 disposed between the second channel pattern SP2 and the third channel pattern SP3, and a fourth portion PO4 on the third channel pattern SP3. The first portion PO1 may be disposed in each of the first and second semiconductor patterns 102a and 102b. The first portion PO1 will be described later in detail.

Figure 2C:
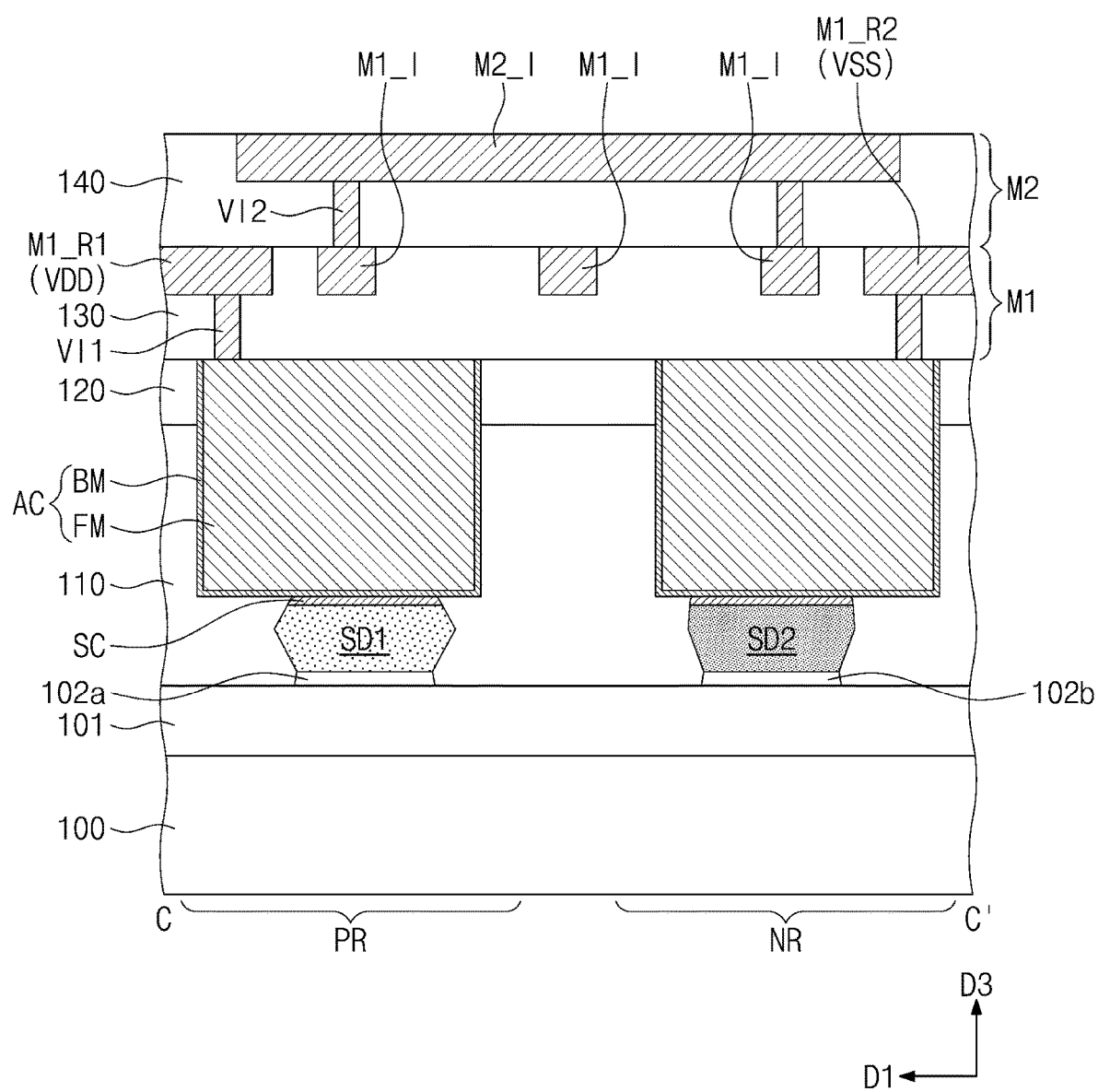
Figure 2D:
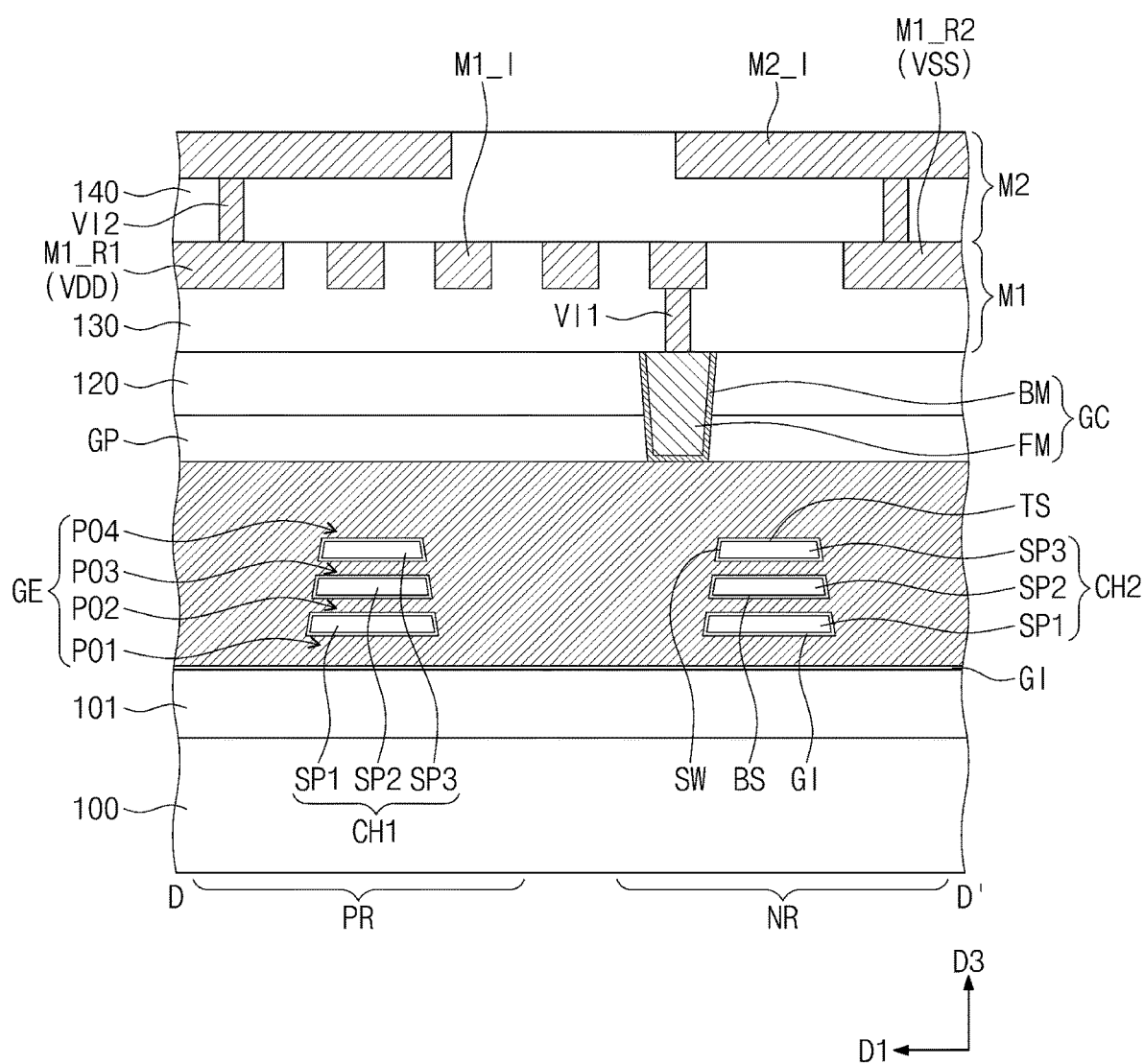

Referring to FIG. 2D, the gate electrode GE may be provided on a top surface TS, a bottom surface BS and both sidewalls SW of each of the first to third channel patterns SP1, SP2 and SP3. In other words, the logic transistor according to the present embodiments may be a gate-all-around type field effect transistor in which the gate electrode GE three-dimensionally surrounds a channel.

The gate electrode GE may include a first metal pattern and a second metal pattern on the first metal pattern. The first metal pattern may be provided on a gate insulating layer GI and may be adjacent to the first to third channel patterns SP1, SP2 and SP3. The first metal pattern may include a work function metal for adjusting a threshold voltage of the logic transistor. A desired threshold voltage of the logic transistor may be obtained by adjusting a thickness and a composition of the first metal pattern.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers. And, the second metal pattern may include a metal having a resistance lower than that of the first metal pattern. For example, the second metal pattern may include at least one metal selected from a group consisting of tungsten (W), aluminum (Al), titanium (Ti), and tantalum (Ta).

The gate insulating layer GI may be disposed between the gate electrode GE and the first channel structure CH1 and between the gate electrode GE and the second channel structure CH2. The gate insulating layer GI may cover the top surface TS, the bottom surface BS and both sidewalls SW of each of the first to third channel patterns SP1, SP2 and SP3. The gate insulating layer GI may also be disposed between the gate electrode GE and the semiconductor patterns 102a and 102b. Particularly, the gate insulating layer GI may be disposed between the first portion PO1 of the gate electrode GE and each of the semiconductor patterns 102a and 102b. The gate insulating layer GI may cover the insulating layer 101 (see FIG. 2D). The gate insulating layer GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

Referring to FIGS. 2A and 2B, a pair of gate spacers GS may be disposed on both sidewalls of the fourth portion PO4 of the gate electrode GE, respectively. The gate spacers GS may extend along the gate electrode GE in the first direction D1 of FIG. 1. Top surfaces of the gate spacers GS may be higher than a top surface of the gate electrode GE. The top surfaces of the gate spacers GS may be coplanar with a top surface of a first interlayer insulating layer 110 to be described later. The gate spacers GS may include at least one of SiCN, SiCON, or SiN. In certain embodiments, each of the gate spacers GS may have a multi-layered structure formed of at least two of SiCN, SiCON, or SiN.

A gate capping pattern GP may be provided on the gate electrode GE. The gate capping pattern GP may extend along the gate electrode GE in the first direction D1. The gate capping pattern GP may include a material having an etch selectivity with respect to first and second interlayer insulating layers 110 and 120 to be described later. For example, the gate capping pattern GP may include at least one of SiON, SiCN, SiCON, or SiN.

Referring to FIG. 2B, insulating patterns IP may be provided on the NMOSFET region NR. The insulating patterns IP may be disposed between the second source/drain pattern SD2 and the second and third portions PO2 and PO3 of the gate electrode GE, respectively. The insulating patterns IP may be in direct contact with the second source/drain pattern SD2. Each of the second and third portions PO2 and PO3 of the gate electrode GE may be spaced apart from the second source/drain pattern SD2 by the insulating pattern IP.

In FIG. 2C, a first interlayer insulating layer 110 may be provided on the insulating layer 101. The first interlayer insulating layer 110 may cover the gate spacers GS and the first and second source/drain patterns SD1 and SD2. The top surface of the first interlayer insulating layer 110 may be substantially coplanar with the top surface of the gate capping pattern GP and the top surface of the gate spacer GS. A second interlayer insulating layer 120 may be disposed on the first interlayer insulating layer 110 and the gate capping pattern GP. For example, each of the first and second interlayer insulating layers 110 and 120 may include a silicon oxide layer.

Source/drain contacts AC may penetrate the second and first interlayer insulating layers 120 and 110 so as to be electrically connected to the first and second source/drain patterns SD1 and SD2, respectively. A pair of the source/drain contacts AC may be provided at both sides of the gate electrode GE, respectively. The source/drain contact AC may have a bar shape extending in the first direction D1 when viewed in a plan view.

The source/drain contact AC may be a self-aligned contact. In other words, the source/drain contact AC may be formed to be self-aligned using the gate capping pattern GP and the gate spacer GS. For example, the source/drain contact AC may cover at least a portion of a sidewall of the gate spacer GS. Even though not shown in the drawings, the source/drain contact AC may cover a portion of the top surface of the gate capping pattern GP.

Silicide patterns SC may be disposed between the source/drain contact AC and the first source/drain pattern SD1 and between the source/drain contact AC and the second source/drain pattern SD2, respectively. The source/drain contact AC may be electrically connected to the source/drain pattern SD1 or SD2 through the silicide pattern SC. The silicide pattern SC may include a metal silicide and may include at least one of, for example, titanium silicide, tantalum silicide, tungsten silicide, nickel silicide, or cobalt silicide.

A gate contact GC may penetrate the second interlayer insulating layer 120 and the gate capping pattern GP so as to be electrically connected to the gate electrode GE. For example, as illustrated in FIG. 2B, an upper region of each of the source/drain contacts AC adjacent to the gate contact GC may be filled with an upper insulating pattern UIP. Thus, it is possible to prevent a process defect in which a short is caused by contact between the gate contact GC and the source/drain contact AC adjacent to the gate contact GC.

Each of the source/drain contact AC and the gate contact GC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover a bottom surface and sidewalls of the conductive pattern FM. The barrier pattern BM may include a metal layer and/or a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be provided in a third interlayer insulating layer 130 provided on the second interlayer insulating layer 120. The first metal layer M1 may include a first lower power interconnection line M1_R1, a second lower power interconnection line M1_R2, and lower interconnection lines M1_I. The lower interconnection lines M1_I may be disposed between the first and second lower power interconnection lines M1_R1 and M1_R2. Each of the lower interconnection lines M1_I may have a line or bar shape extending in the second direction D2.

The first metal layer M1 may further include lower vias VI1. The lower vias VI1 may be provided under the interconnection lines M1_R1, M1_R2 and M1_I of the first metal layer M1. Some of the lower vias VI1 may be disposed between the source/drain contacts AC and corresponding ones of the interconnection lines M1_R1, M1_R2 and M1_I of the first metal layer M1, respectively. Others of the lower vias VI1 may be disposed between the gate contacts GC and corresponding ones of the interconnection lines M1_R1, M1_R2 and M1_I of the first metal layer M1, respectively.

A second metal layer M2 may be provided in a fourth interlayer insulating layer 140 provided on the third interlayer insulating layer 130. The second metal layer M2 may include upper interconnection lines M2_I. Referring to FIGS. 2B and 2C, each of the upper interconnection lines M2_I of the second metal layer M2 may have a line or bar shape extending in the first direction D1. In other words, the upper interconnection lines M2_I may extend in the first direction D1 in parallel to each other. The second metal layer M2 may further include upper vias VI2. The upper vias VI2 may be provided under the upper interconnection lines M2_I. The upper vias VI2 may be disposed between the upper interconnection lines M2_I and the interconnection lines M1_R1, M1_R2 and M1_I of the first metal layer M1.

The interconnection lines of the first metal layer M1 and the interconnection lines of the second metal layer M2 may include the same conductive material or different conductive materials. For example, each of the interconnection lines of the first and second metal layers M1 and M2 may include at least one metal material selected from a group consisting of aluminum, copper, tungsten, molybdenum, and cobalt. Even though not shown in the drawings, stacked metal layers (e.g., M3, M4, M5, etc.) may be additionally disposed on the fourth interlayer insulating layer 140. Each of the stacked metal layers may include routing interconnection lines.

Figure 3A:
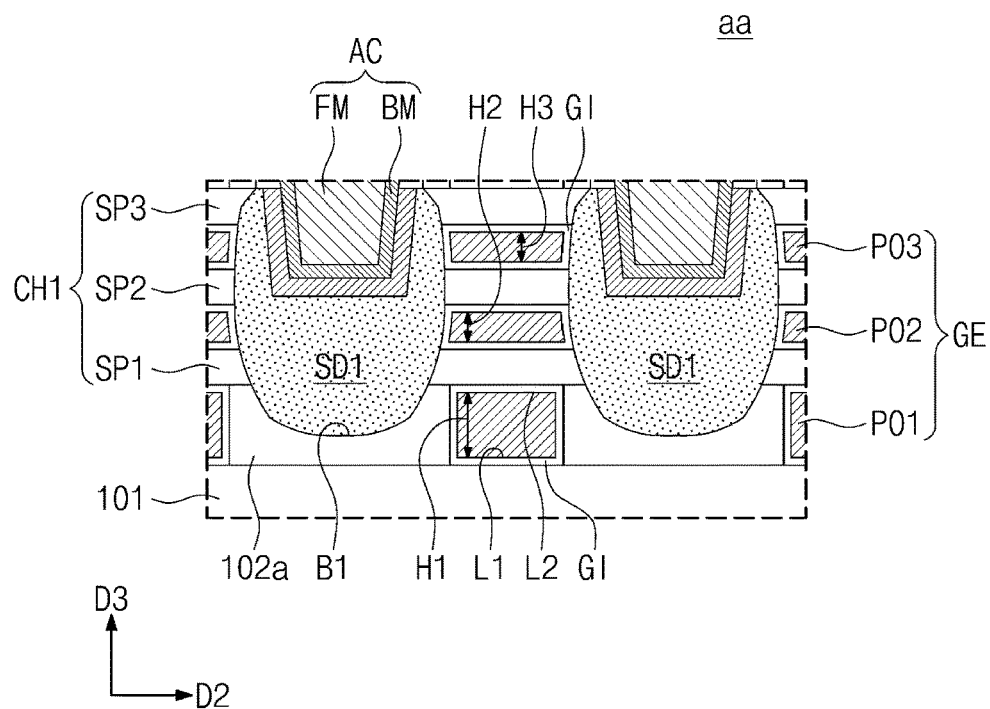
FIG. 3A is an enlarged view of a portion 'aa' of FIG. 2A.
Figure 3B:
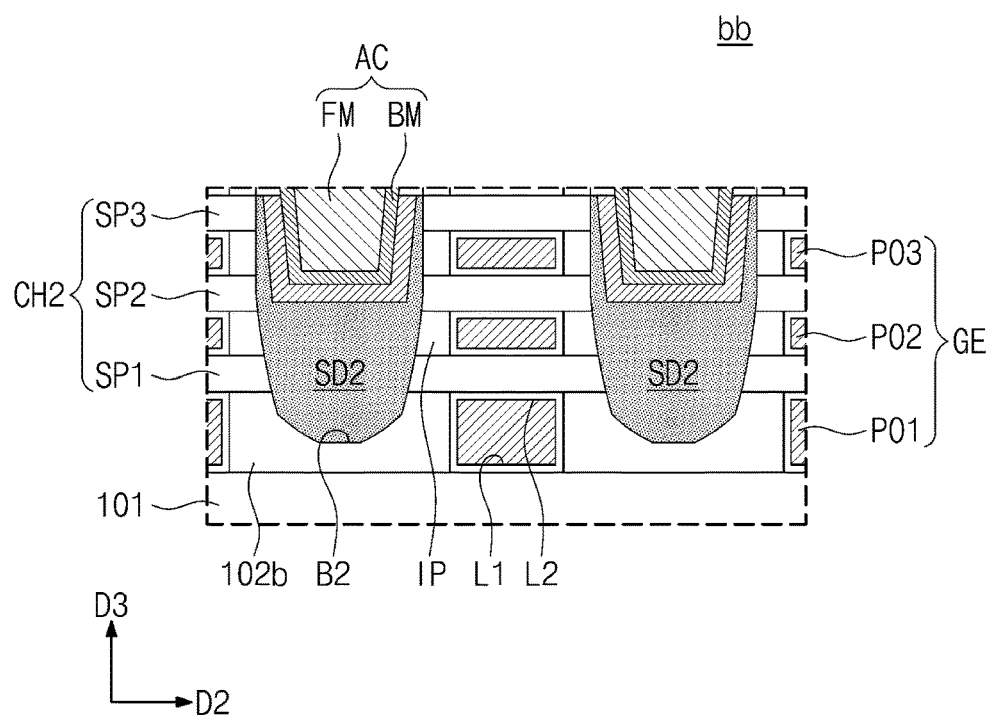
FIG. 3B is an enlarged view of a portion 'bb' of FIG. 2B.

FIG. 3A is an enlarged view of a portion 'aa' of FIG. 2A. FIG. 3B is an enlarged view of a portion 'bb' of FIG. 2B. Referring to FIGS. 3A and 3B, the first portion PO1 of the gate electrode GE may be disposed in each of the semiconductor patterns 102a and 102b. The first portion PO1 of the gate electrode GE may correspond to a lowermost portion of the gate electrode GE. The first portion PO1 of the gate electrode GE may penetrate each of the semiconductor patterns 102a and 102b.

Referring to FIG. 3A, the first portion PO1 of the gate electrode GE may have a bottom surface L1 and a top surface L2 opposite to each other between the insulating layer 101 and the first channel pattern SP1. A level of the bottom surface L1 of the first portion PO1 may be lower than a level of a bottommost surface B1 of the first source/drain pattern SD1. A level of the top surface L2 of the first portion PO1 of the gate electrode GE may be higher than the level of the bottommost surface B1 of the first source/drain pattern SD1. In other words, the level of the bottommost surface B1 of the first source/drain pattern SD1 may be located between the level of the bottom surface L1 and the level of the top surface L2 of the first portion PO1.

A level of a bottommost surface B2 of the second source/drain pattern SD2 may also be located between the level of the bottom surface L1 and the level of the top surface L2 of the first portion PO1 (see FIG. 3B).

A thickness H1 of the first portion PO1 may be different from a thickness H2 of the second portion PO2 and a thickness H3 of the third portion PO3. The thickness H1 of the first portion PO1 may be greater than the thickness H2 of the second portion PO2 and the thickness H3 of the third portion PO3. The thickness H1 of the first portion PO1 may range from 200% to 300% of each of the thicknesses H2 and H3 of the second and third portions PO2 and PO3.

In FIG. 3A, the gate insulating layer GI surrounding the second and third portions PO2 and PO3 of the gate electrode GE may be in contact with the first source/drain pattern SD1. The gate insulating layer GI surrounding the first portion PO1 of the gate electrode GE may not be in contact with the first source/drain pattern SD1. The gate insulating layer GI surrounding the first portion PO1 may be spaced apart from the first source/drain pattern SD1 with the first semiconductor pattern 102a interposed therebetween.

In FIG. 3B, the insulating patterns IP may be disposed between each of the second and third portions PO2 and PO3 and the second source/drain patterns SD2, but the insulating pattern IP may not be provided between the first portion PO1 and the second source/drain patterns SD2. The first portion PO1 may be spaced apart from the second source/drain pattern SD2 in the second direction D2 with the second semiconductor pattern 102b interposed therebetween.

In FIGS. 3A and 3B, a width, in the second direction D2, of the first portion PO1 of the gate electrode GE of the PMOSFET region PR may be substantially equal to a width, in the second direction D2, of the first portion PO1 of the gate electrode GE of the NMOSFET region NR. On the contrary, a width, in the second direction D2, of the second portion PO2 of the gate electrode GE of the PMOSFET region PR may be different from a width, in the second direction D2, of the second portion PO2 of the gate electrode GE of the NMOSFET region NR. A width, in the second direction D2, of the third portion PO3 of the gate electrode GE of the PMOSFET region PR may be different from a width, in the second direction D2, of the third portion PO3 of the gate electrode GE of the NMOSFET region NR. In addition, a distance from the insulating layer 101 to each of the source/drain patterns SD1 and SD2 in the third direction D3 may be greater than a distance from the insulating layer 101 to the first portion PO1 of the gate electrode GE in the third direction D3.

According to the embodiments of the inventive concepts, the semiconductor patterns 102a and 102b may not be disposed under the first portion PO1 corresponding to the lowermost portion of the gate electrode GE. As a result, a channel may not be formed under the first portion PO1, and thus it is possible to prevent a leakage current from flowing under the gate electrode GE (e.g., prevention of punch through effect).

In addition, according to the embodiments of the inventive concepts, the bottommost surfaces B1 and B2 of the first and second source/drain patterns SD1 and SD2 may be located at the level between the bottom surface L1 and the top surface L2 of the first portion PO1 of the gate electrode GE, and thus reliability of the device may be increased. In detail, the first and second source/drain patterns SD1 and SD2 may be spaced apart from the insulating layer 101 in the third direction D3 with the semiconductor patterns 102a and 102b interposed therebetween. When the source/drain patterns SD1 and SD2 are epitaxially grown from the semiconductor patterns 102a and 102b in the third direction D3 as described later in FIGS. 11A to 11C, stacking faults may not occur, and thus reliability may be improved. If the epitaxial growth is performed from the insulating layer 101, stacking faults may be generated in the first source/drain pattern SD1, and the compressive stress applied to the first channel structure CH1 may be reduced. In this case, reliability of the device may be deteriorated.

Figure 4A:
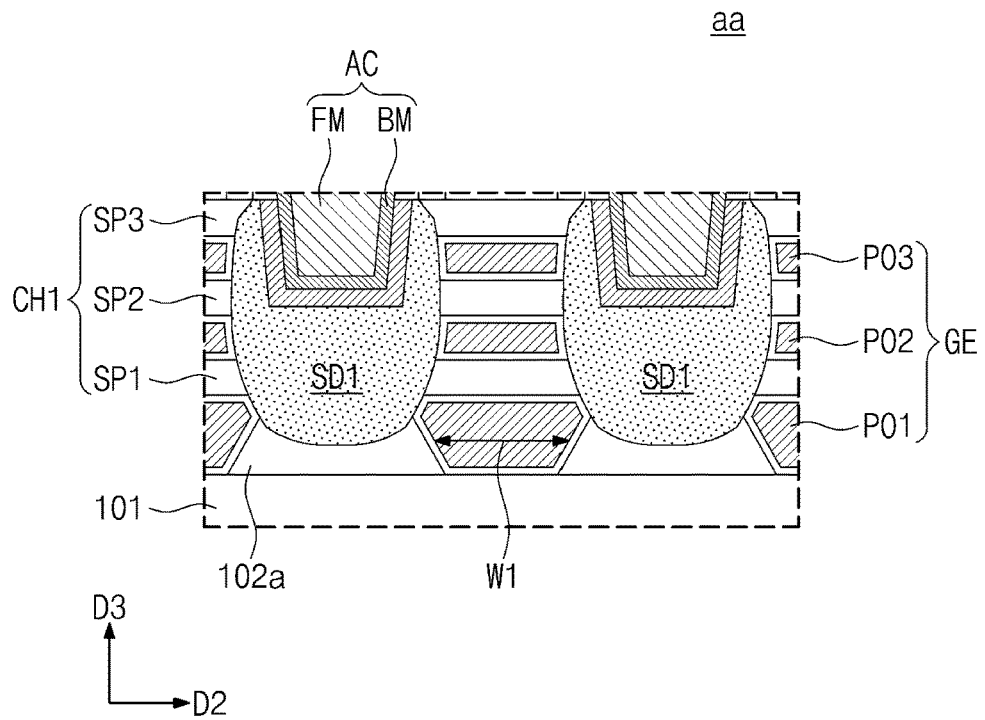
FIG. 4A is an enlarged view corresponding to the portion 'aa' of FIG. 2A according to some embodiments of the inventive concepts.
Figure 4B:
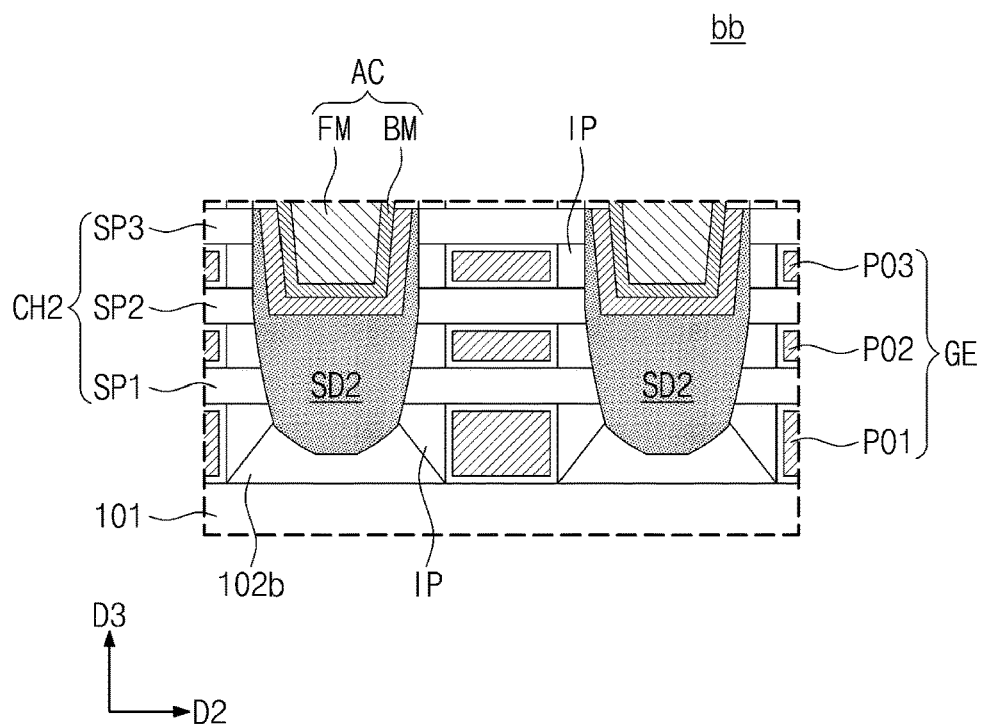
FIG. 4B is an enlarged view corresponding to the portion 'bb' of FIG. 2B according to some embodiments of the inventive concepts.

FIG. 4A is an enlarged view corresponding to the portion 'aa' of FIG. 2A according to some embodiments of the inventive concepts. FIG. 4B is an enlarged view corresponding to the portion 'bb' of FIG. 2B according to some embodiments of the inventive concepts. Hereinafter, the descriptions to the same features as in the embodiments of FIGS. 3A and 3B will be omitted for the purpose of ease and convenience in explanation.

Referring to FIG. 4A, a width W1, in the second direction D2, of the first portion PO1 of the gate electrode GE may increase as a height from the insulating layer 101 in the third direction D3 increases. The gate insulating layer GI surrounding the first portion PO1 may be in contact with the first source/drain pattern SD1. In certain embodiments, the gate insulating layer GI surrounding the first portion PO1 may not be in contact with the first source/drain pattern SD1. The increase of the width W1, in the second direction D2, of the first portion PO1 of the gate electrode GE in the present embodiments may be realized when an upper portion of the first semiconductor pattern 102a around a first sacrificial pattern 200P is etched in a process of etching the first sacrificial pattern 200P described later in FIGS. 13A to 13C.

Referring to FIG. 4B, an insulating pattern IP may be provided between the first portion PO1 of the gate electrode GE and the second source/drain pattern SD2. The insulating pattern IP may be disposed in an etched upper portion of the second semiconductor pattern 102b when the upper portion of the second semiconductor pattern 102b around the first sacrificial pattern 200P is also etched in the process described later in FIGS. 13A to 13C.

Figure 5A:
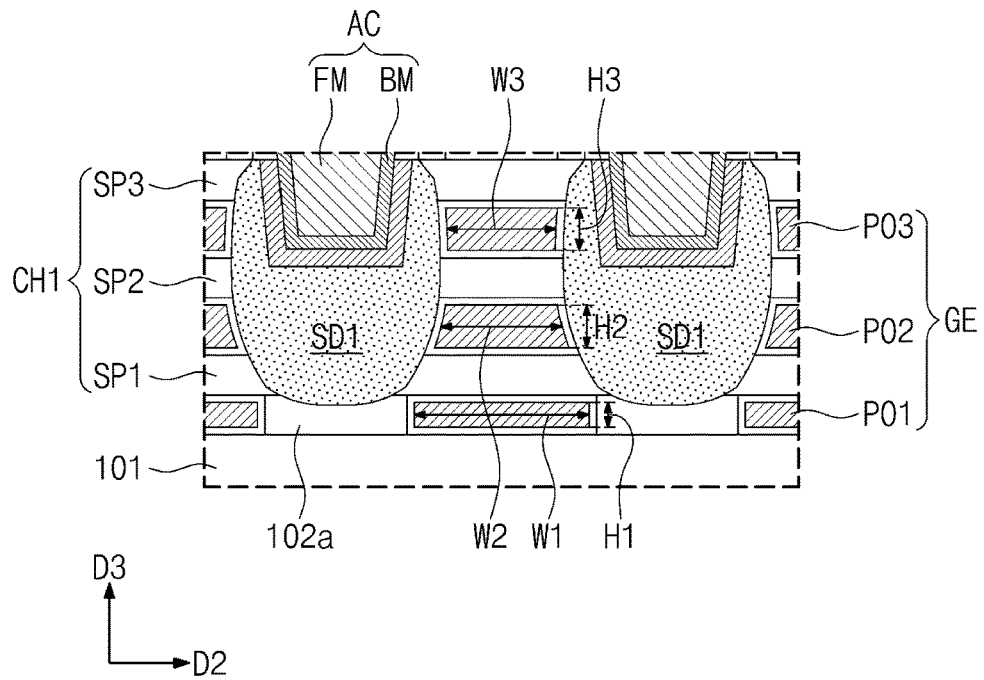
FIG. 5A is an enlarged view corresponding to the portion 'aa' of FIG. 2A according to some embodiments of the inventive concepts.
Figure 5B:
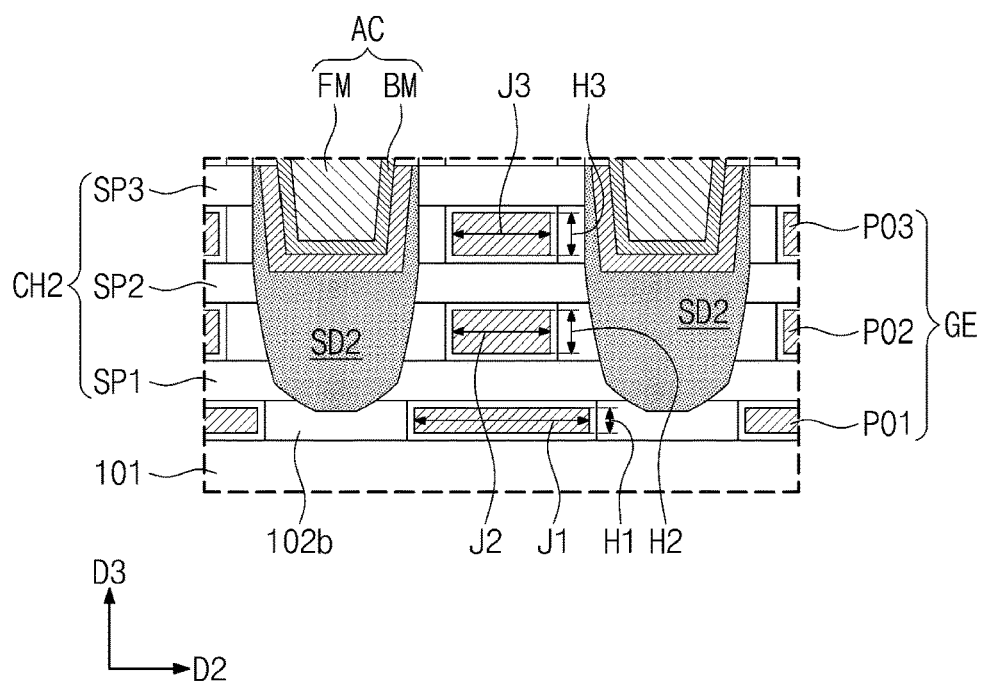
FIG. 5B is an enlarged view corresponding to the portion 'bb' of FIG. 2B according to some embodiments of the inventive concepts.

FIG. 5A is an enlarged view corresponding to the portion 'aa' of FIG. 2A according to some embodiments of the inventive concepts. FIG. 5B is an enlarged view corresponding to the portion 'bb' of FIG. 2B according to some embodiments of the inventive concepts. Hereinafter, the descriptions to the same features as in the embodiments of FIGS. 3A and 3B will be omitted for the purpose of ease and convenience in explanation.

Referring to FIGS. 5A and 5B, a thickness H1 of the first portion PO1 may be less than a thickness H2 of the second portion PO2 and a thickness H3 of the third portion PO3. In FIG. 5A, a width W1, in the second direction D2, of the first portion PO1 between the first source/drain patterns SD1 may be greater than a width W2 of the second portion PO2 in the second direction D2 and a width W3 of the third portion PO3 in the second direction D2. In FIG. 5B, a width J1, in the second direction D2, of the first portion PO1 between the second source/drain patterns SD2 may be greater than a width J2 of the second portion PO2 in the second direction D2 and a width J3 of the third portion PO3 in the second direction D2.

FIGS. 6A to 14C are cross-sectional views illustrating a method of manufacturing a semiconductor device, according to some embodiments of the inventive concepts. FIGS. 6A, 7A, 8A, 9A, 10A, 11A, 12A, 13A and 14A are cross-sectional views corresponding to the line A-A' of FIG. 1. FIGS. 10B, 11B, 12B, 13B and 14B are cross-sectional views corresponding to the line B-B' of FIG. 1. FIGS. 6B, 7B, 8B, 10C, 11C and 12C are cross-sectional views corresponding to the line C-C' of FIG. 1. FIGS. 6C, 7C, 8C, 9B, 12D, 13C and 14C are cross-sectional views corresponding to the line D-D' of FIG. 1.

Figure 6A:
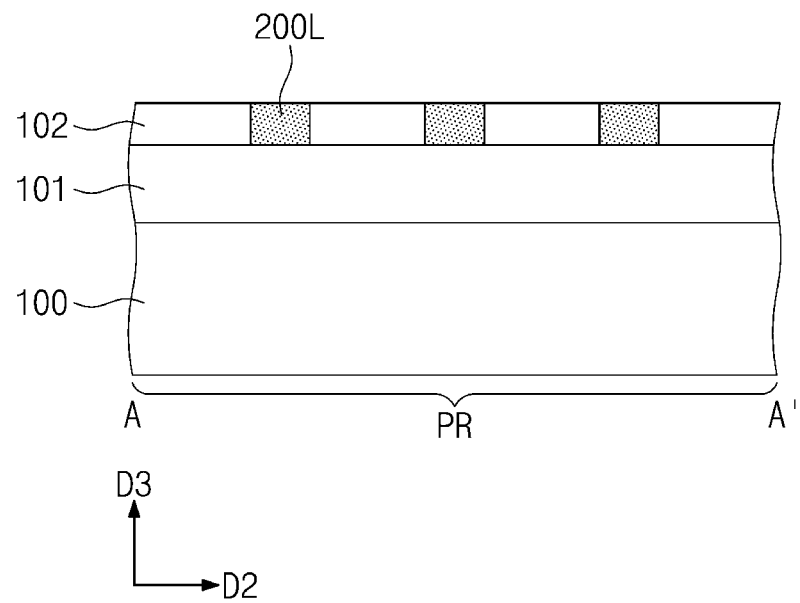
Figure 6B:
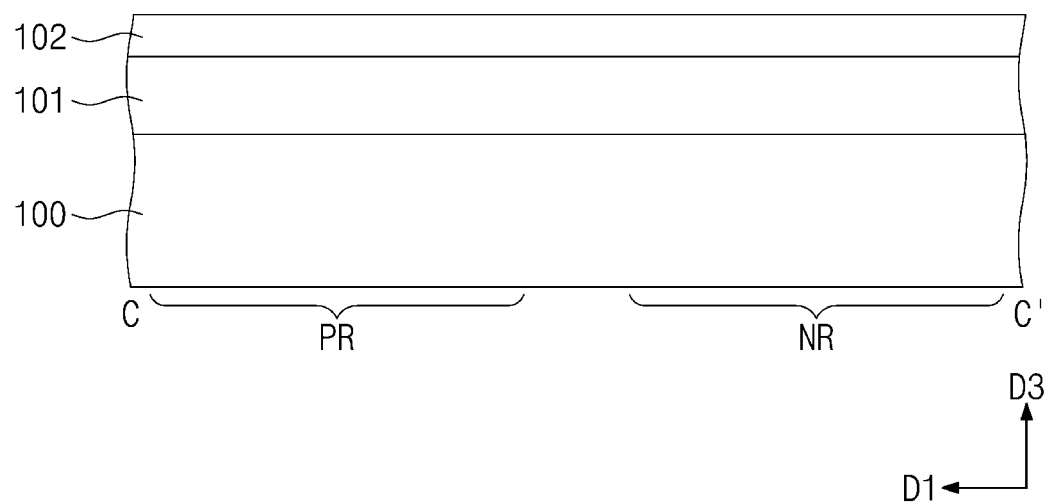
FIGS. 6B, 7B, 8B, 10C, 11C and 12C are cross-sectional views corresponding to the line C-C' of FIG. 1.
Figure 6C:
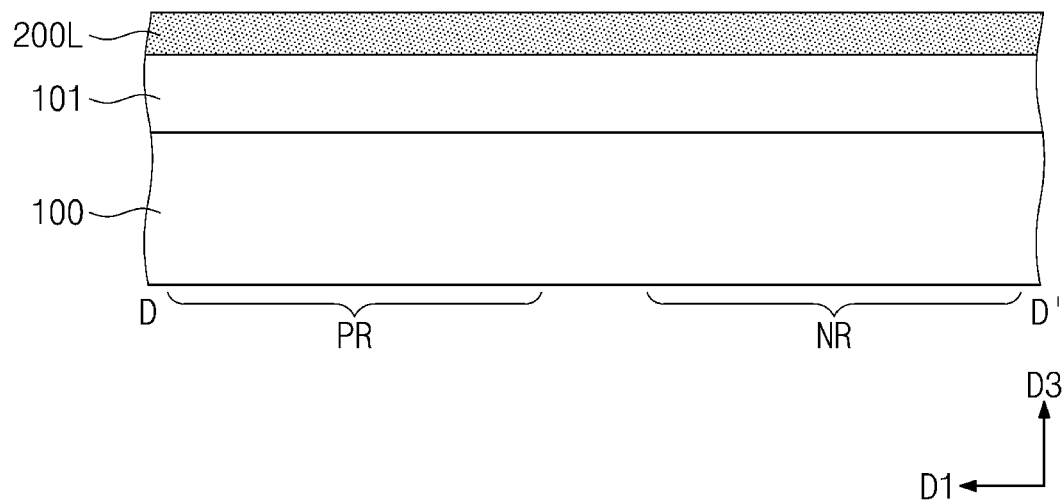

Referring to FIGS. 6A, 6B and 6C, a support substrate 100, an insulating layer 101 and a semiconductor layer 102 may be provided. Sacrificial lines 200L may be formed in the semiconductor layer 102. The sacrificial lines 200L may include germanium (Ge) or silicon-germanium (SiGe). The sacrificial lines 200L may have line shapes extending in the first direction D1. The sacrificial lines 200L may be spaced apart from each other in the second direction D2.

Figure 7A:
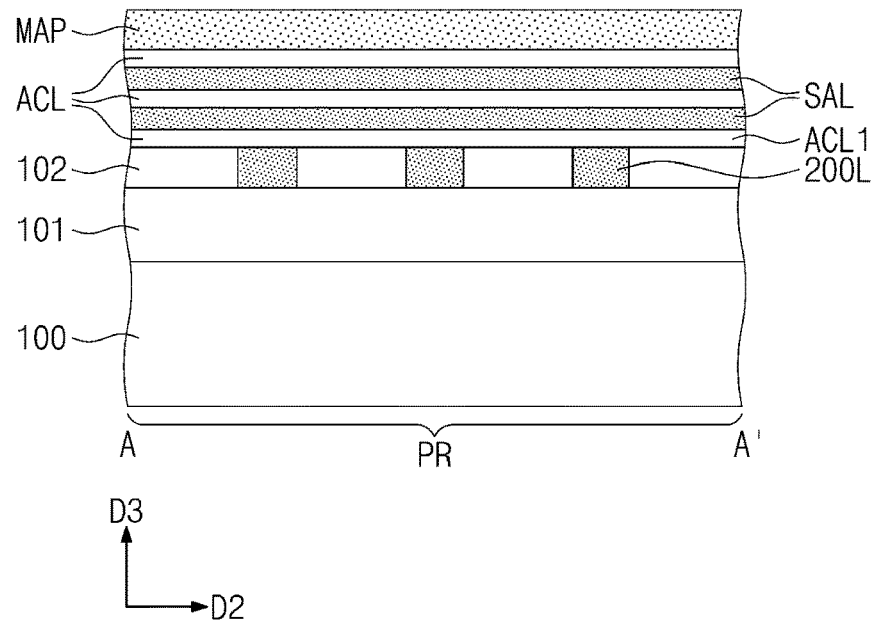
Figure 7B:
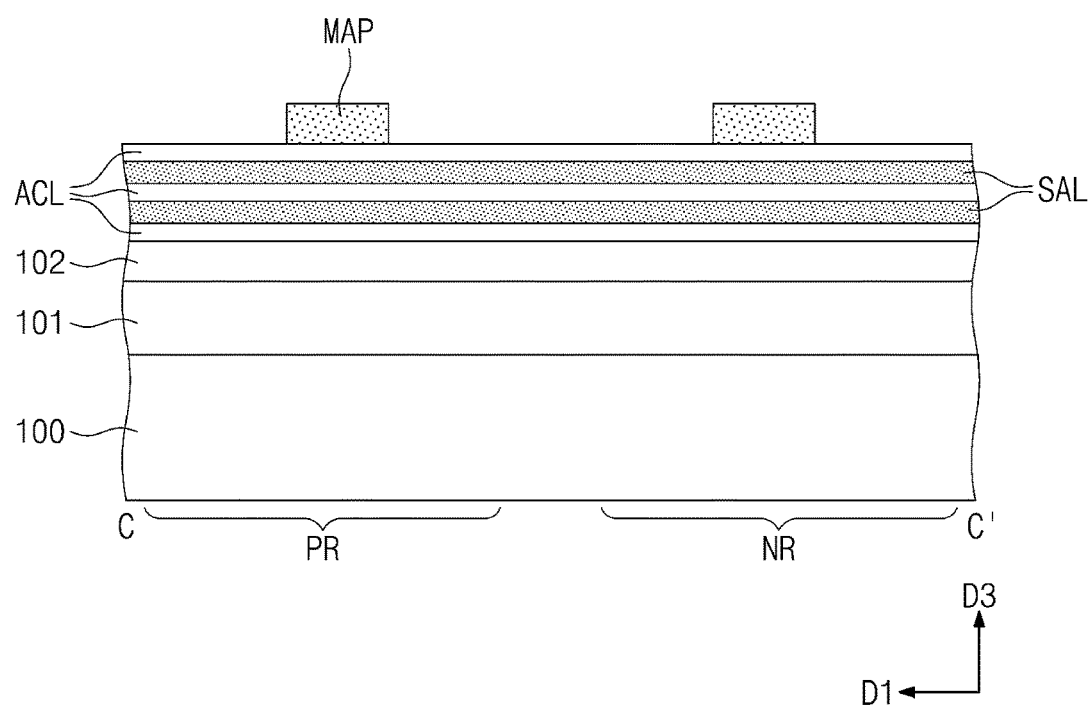
Figure 7C:
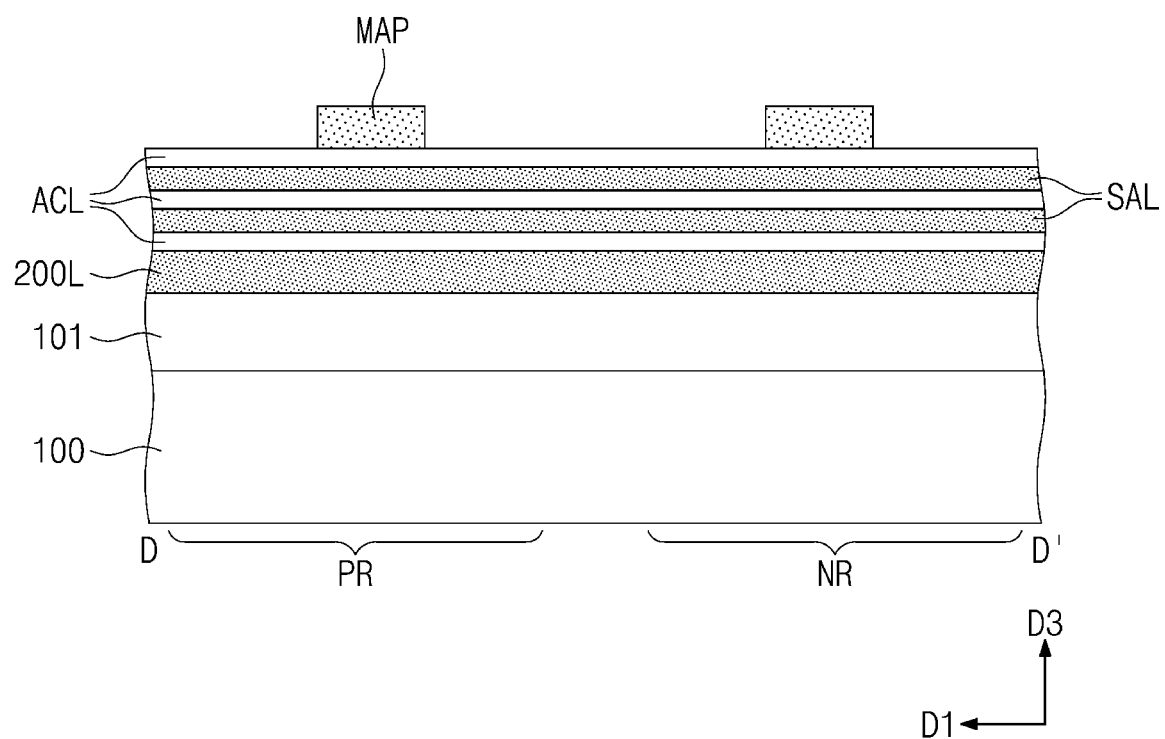

Referring to FIGS. 7A, 7B and 7C, active layers ACL and sacrificial layers SAL which are alternately stacked may be formed on the support substrate 100. The active layers ACL may include silicon (Si), and the sacrificial layers SAL may include germanium (Ge) or silicon-germanium (SiGe). Three active layers ACL and two sacrificial layers SAL are illustrated as an example. In certain embodiments, the numbers of the active layers ACL and the sacrificial layers SAL alternately stacked may be variously changed. A lowermost active layer ACL1 is formed directly on the semiconductor layer 102 in the drawings. Alternatively, in certain embodiments, the sacrificial layer SAL may be additionally formed between the semiconductor layer 102 and the lowermost active layer ACL1 (see FIGS. 16A and 16B). In this case, three sacrificial layers SAL and three active layers ACL may be formed.

A mask pattern MAP may be formed on each of a PMOSFET region PR and an NMOSFET region NR. The mask pattern MAP may have a line shape or bar shape extending in the second direction D2. For example, the mask pattern MAP may include silicon nitride.

Figure 8A:
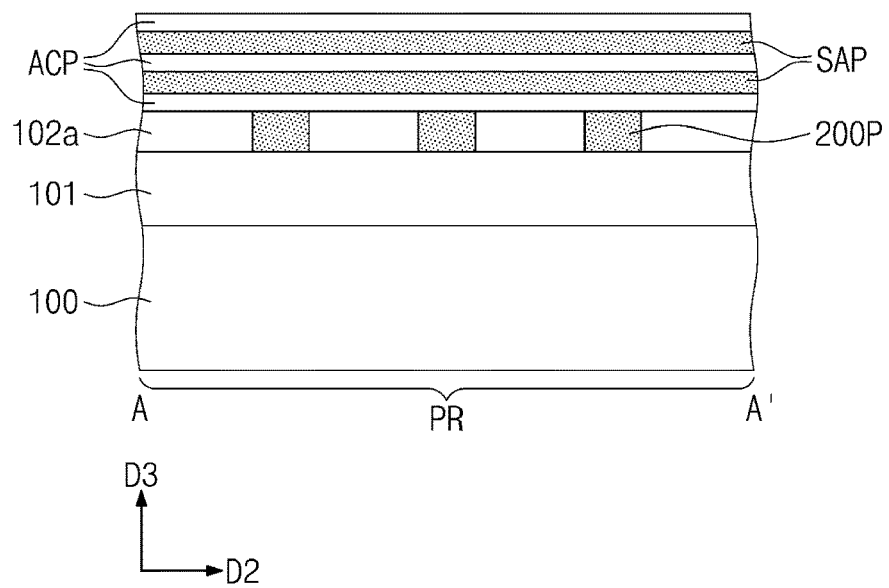
Figure 8B:
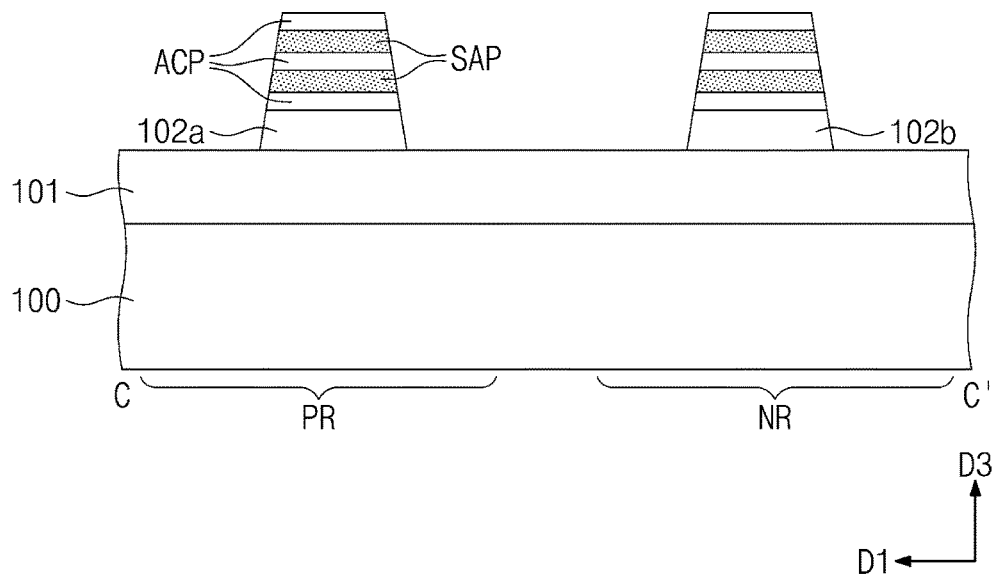
Figure 8C:
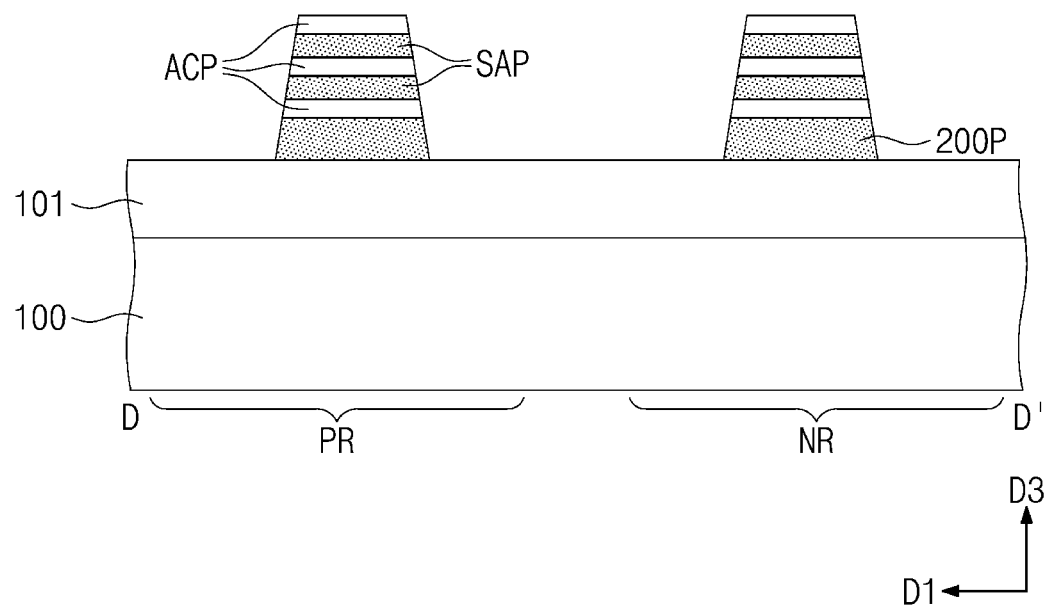

Referring to FIGS. 8A, 8B and 8C, a patterning process may be performed on the sacrificial layers SAL, the active layers ACL, the semiconductor layer 102 and the sacrificial lines 200L by using the mask patterns MAP as etch masks. A first semiconductor pattern 102a and a second semiconductor pattern 102b may be formed from the semiconductor layer 102 by the patterning process. The second semiconductor pattern 102b may be substantially the same as the first semiconductor pattern 102a, and thus a cross-sectional view taken along the line B-B' of FIG. 1 is omitted. The first semiconductor pattern 102a and the second semiconductor pattern 102b may be formed on the PMOSFET region PR and the NMOSFET region NR, respectively. By the patterning process, first sacrificial patterns 200P, active patterns ACP and second sacrificial patterns SAP like FIG. 8C may be formed from the sacrificial lines 200L, the active layers ACL and the sacrificial layers SAL, respectively. A portion of a top surface of the insulating layer 101 may be exposed by the patterning process.

Figure 9A:
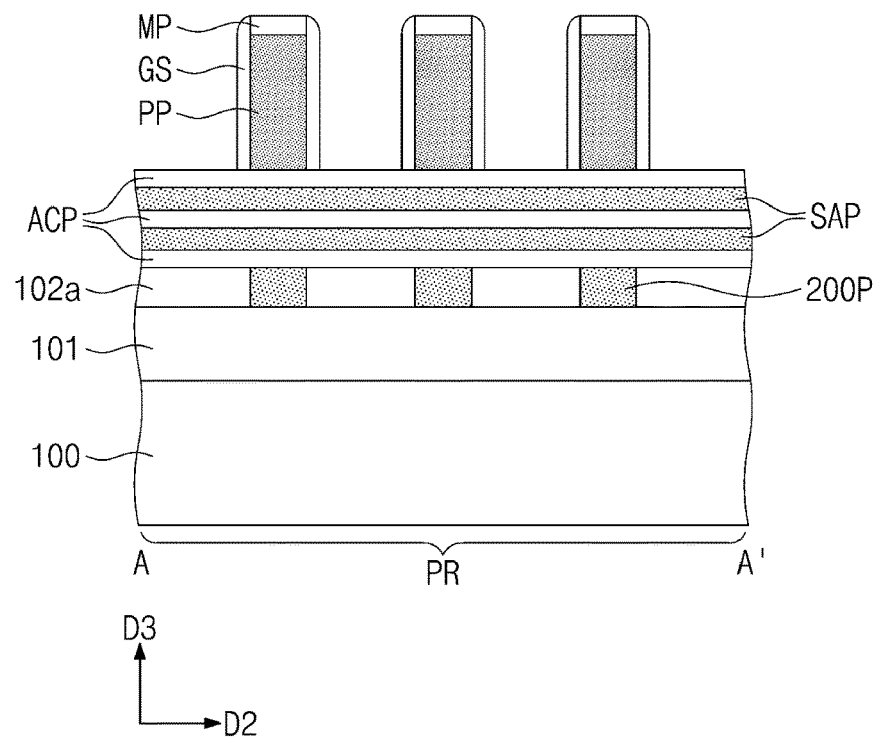
Figure 9B:
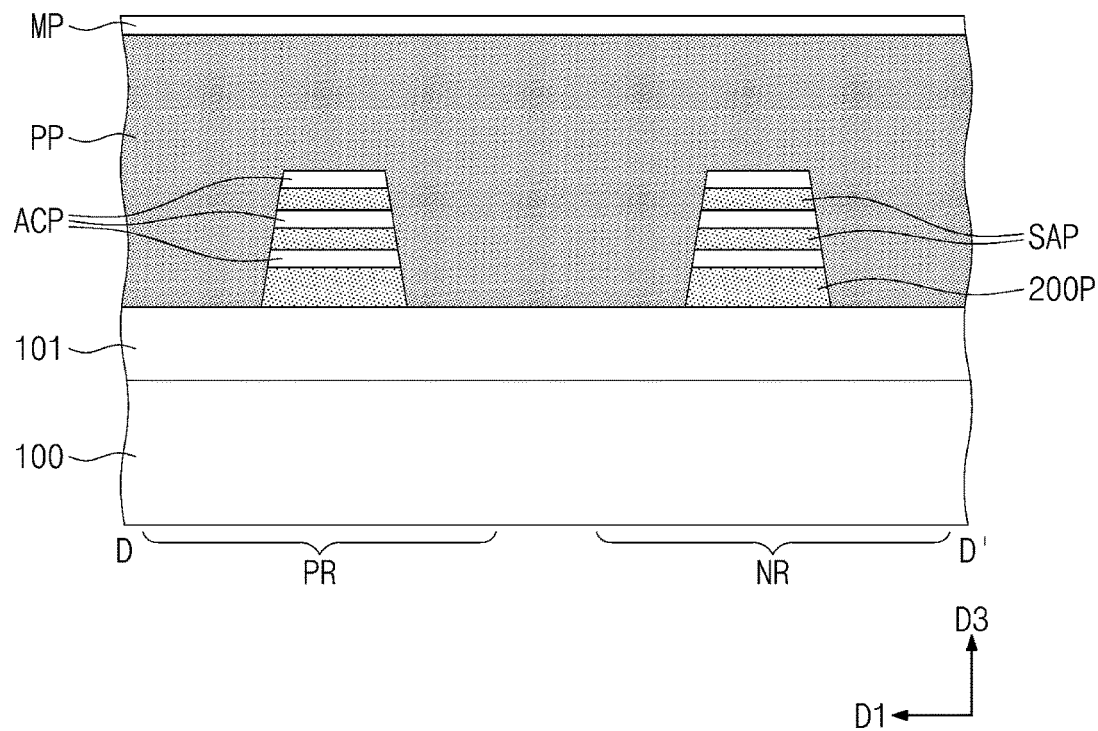

Referring to FIGS. 9A and 9B, third sacrificial patterns PP intersecting the first semiconductor pattern 102a and the second semiconductor pattern 102b may be formed on the insulating layer 101. Each of the third sacrificial patterns PP may have a line shape or bar shape extending in the first direction D1. The third sacrificial patterns PP may be arranged at a predetermined pitch in the second direction D2. For example, the formation of the third sacrificial patterns PP may include forming a sacrificial layer on an entire top surface of the support substrate 100, forming hard mask patterns MP on the sacrificial layer, and patterning the sacrificial layer using the hard mask patterns MP as etch masks. The sacrificial layer may include poly-silicon.

A pair of gate spacers GS may be formed on both sidewalls of each of the third sacrificial patterns PP, respectively. The formation of the gate spacers GS may include conformally forming a gate spacer layer on the support substrate 100 and anisotropically etching the gate spacer layer. For example, the gate spacer layer may include at least one of SiCN, SiCON, or SiN. In certain embodiments, the gate spacer layer may be formed of a multi-layer including at least two of SiCN, SiCON, or SiN.

Figure 10A:
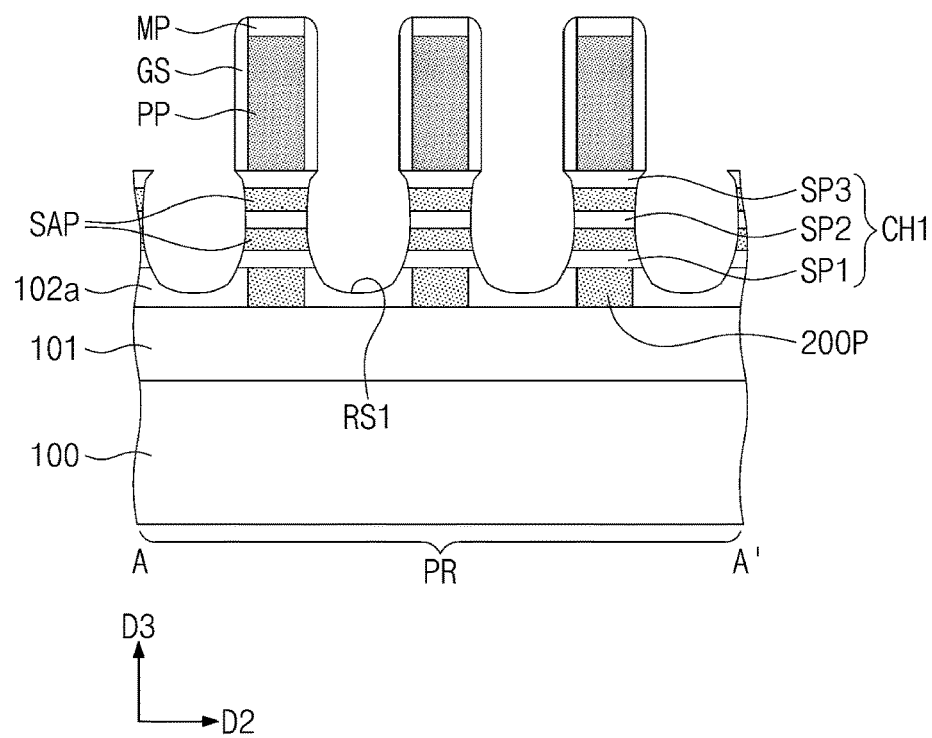
Figure 10B:
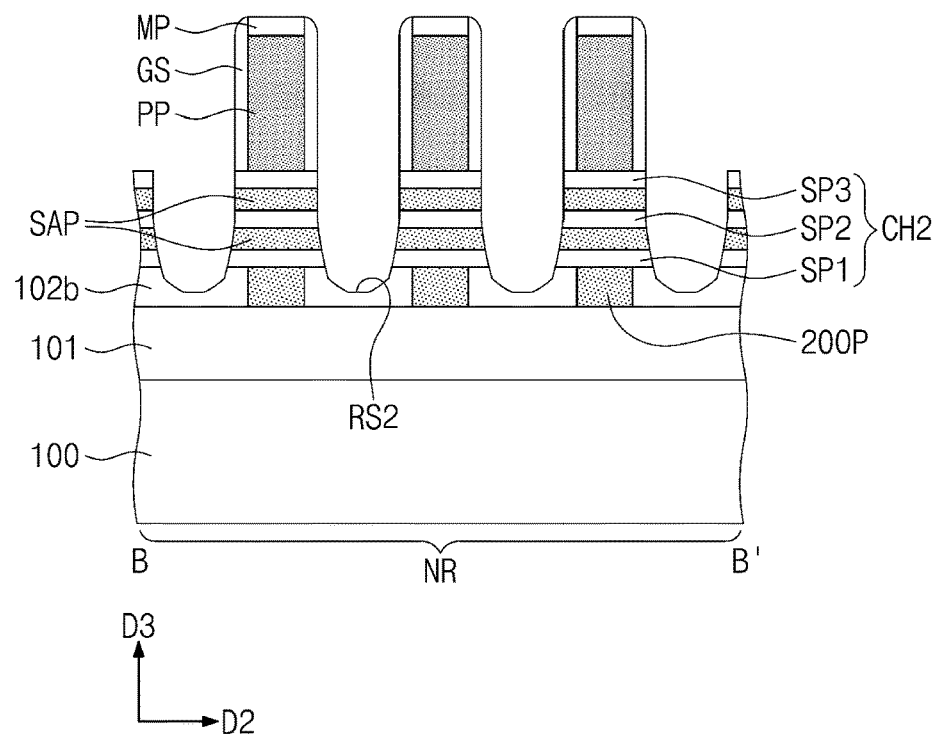
FIGS. 10B, 11B, 12B, 13B and 14B are cross-sectional views corresponding to the line B-B' of FIG. 1.
Figure 10C:
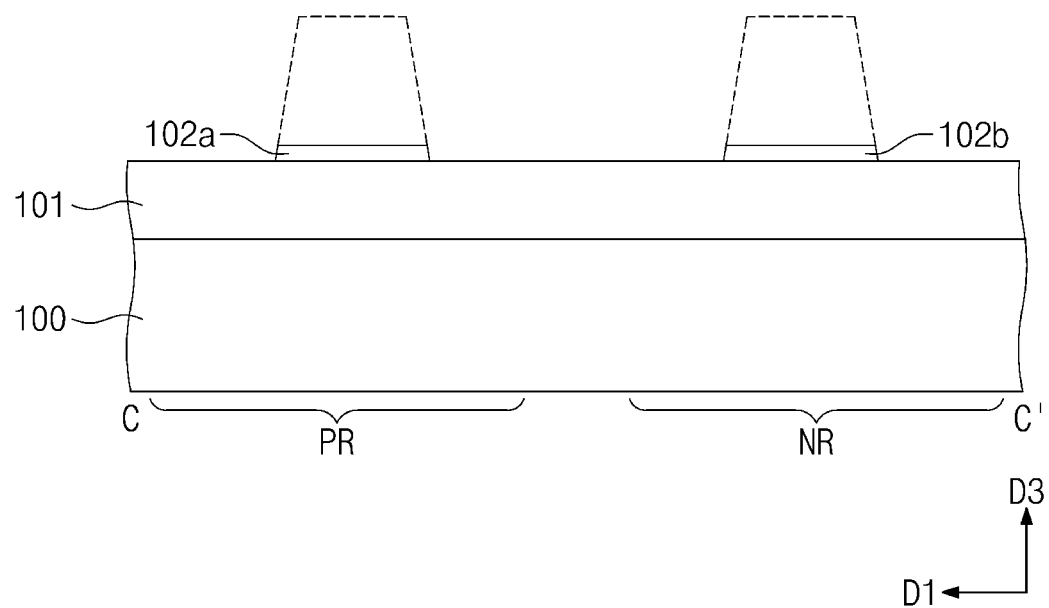

Referring to FIGS. 10A to 10C, first recesses RS1 may be formed in an upper portion of the first semiconductor pattern 102a. Second recesses RS2 may be formed in an upper portion of the second semiconductor pattern 102b. For example, the active patterns ACP, the second sacrificial patterns SAP, the upper portion of the first semiconductor pattern 102a and the upper portion of the second semiconductor pattern 102b may be etched using the hard mask patterns MP and the gate spacers GS as etch masks. The first recess RS1 may be formed between a pair of the third sacrificial patterns PP. First channel structures CH1 may be formed from the active patterns ACP by the formation of the first recesses RS1.

The first channel structures CH1 may be spaced apart from each other in the second direction D2 and may be formed under the third sacrificial patterns PP, respectively. The first recesses RS1 may not expose the insulating layer 101. The etching process for forming the first recesses RS1 may be performed until a bottommost surface of the first recess RS1 is located at a level between a top surface and a bottom surface of the first sacrificial pattern 200P. The second recesses RS2 may be formed by the same method as the first recesses RS1 described above.

In FIGS. 10A and 10B, the first sacrificial patterns 200P may not be etched. In certain embodiments, when widths of the first sacrificial patterns 200P in the second direction D2 are greater than widths of the second sacrificial patterns SAP in the second direction D2, edge portions of upper portions of the first sacrificial patterns 200P may also be etched.

The second recesses RS2 of the upper portion of the second semiconductor pattern 102b may be formed by the same method as the first recesses RS1 described above. Second channel structures CH2 may be formed from the active patterns ACP by the formation of the second recesses RS2. The second channel structures CH2 may be spaced apart from each other in the second direction D2 and may be formed under the third sacrificial patterns PP, respectively.

Figure 11A:
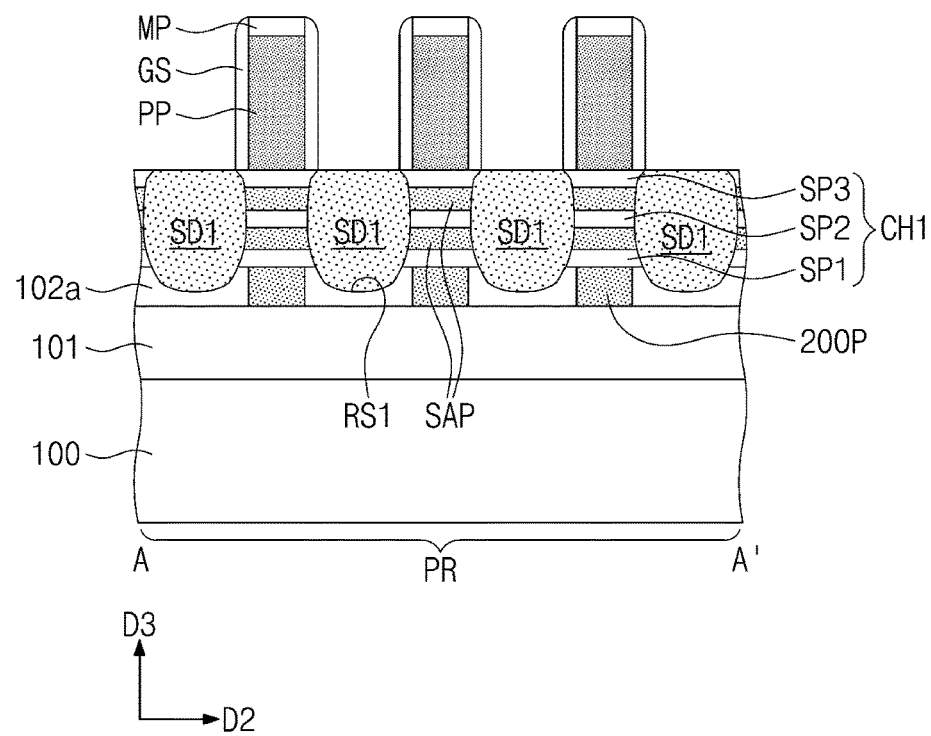
Figure 11B:
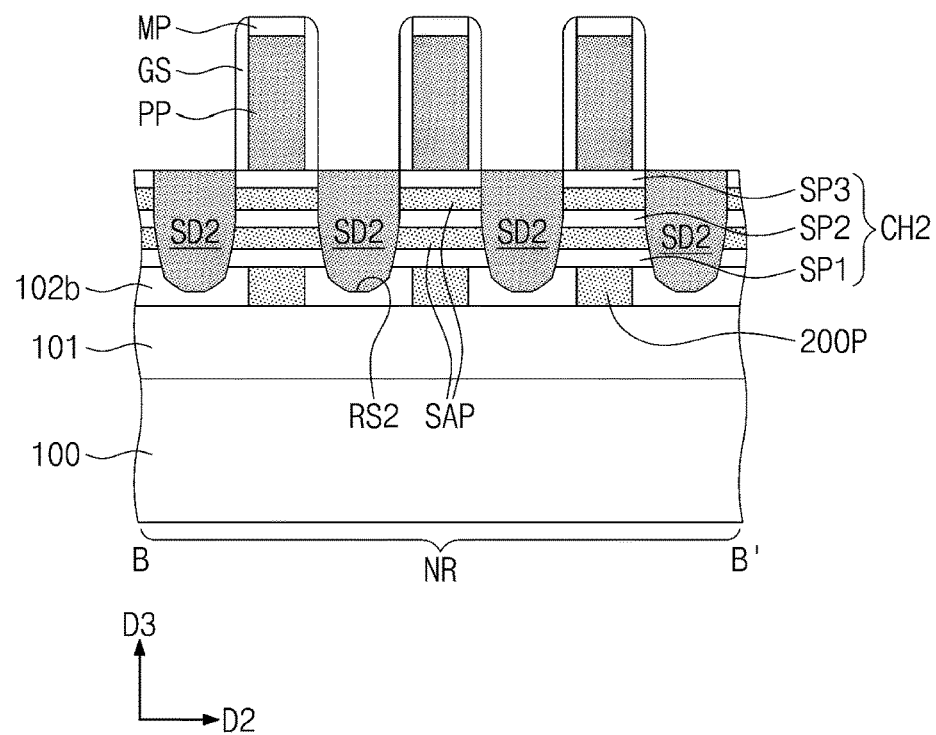
Figure 11C:
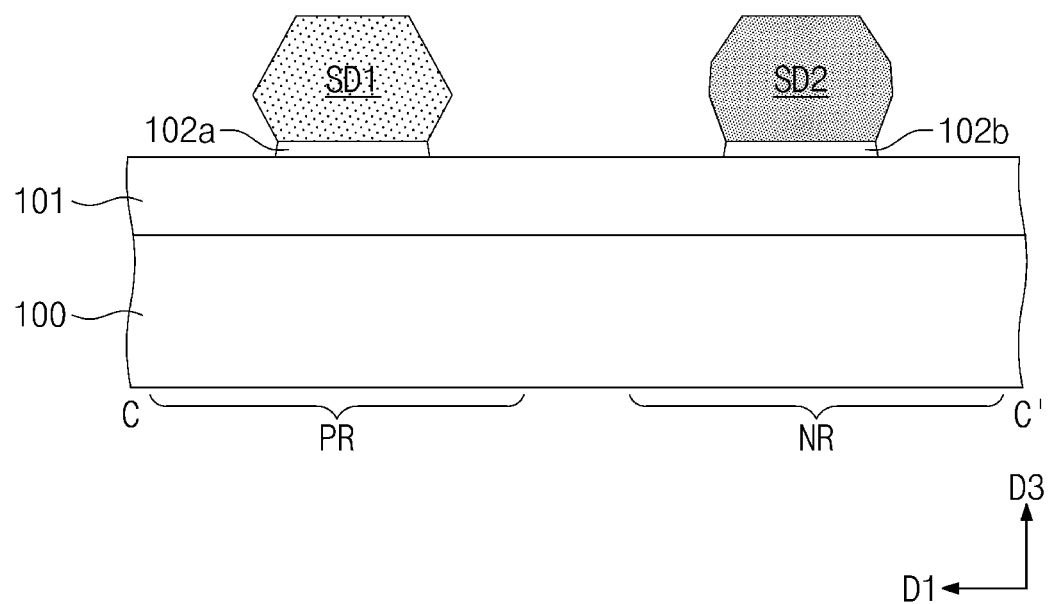
Figure 12A:
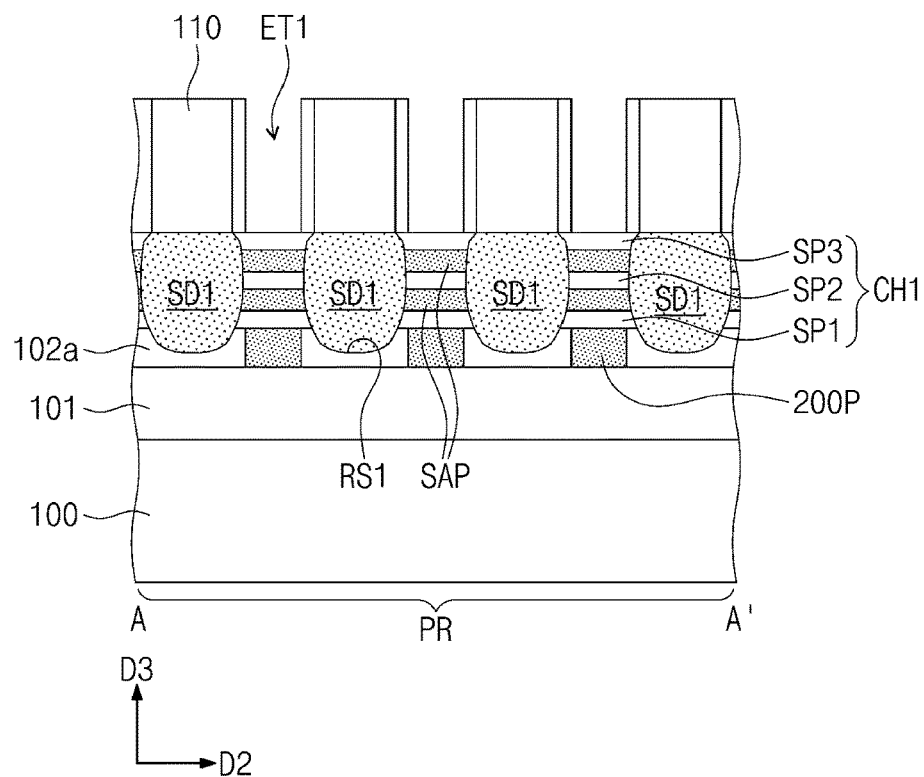
Figure 12B:
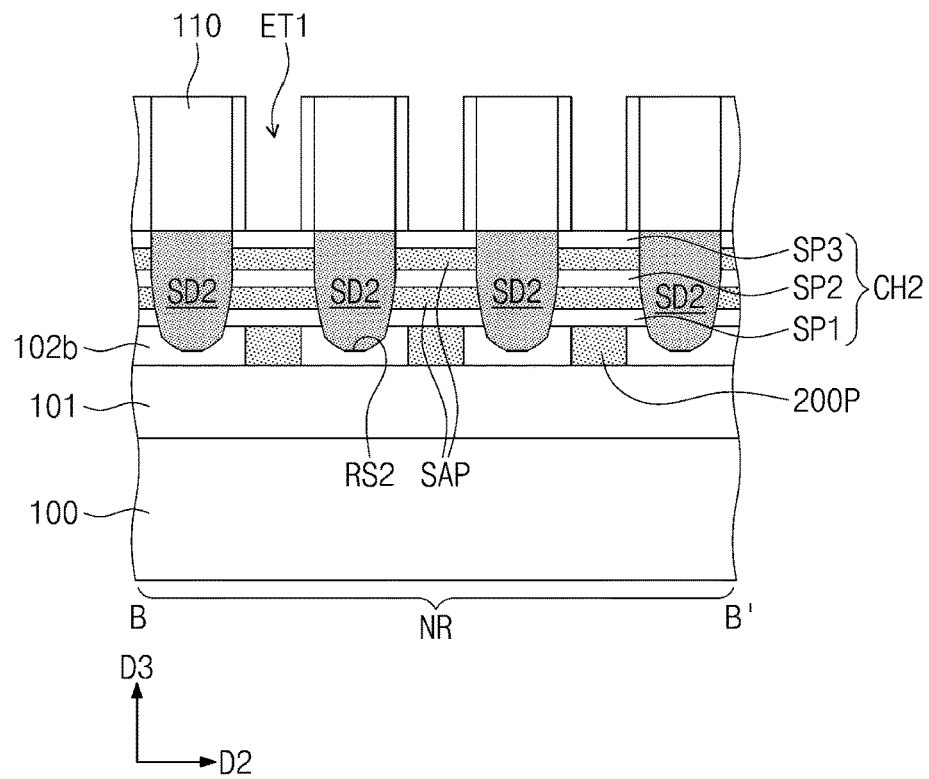
Figure 12C:
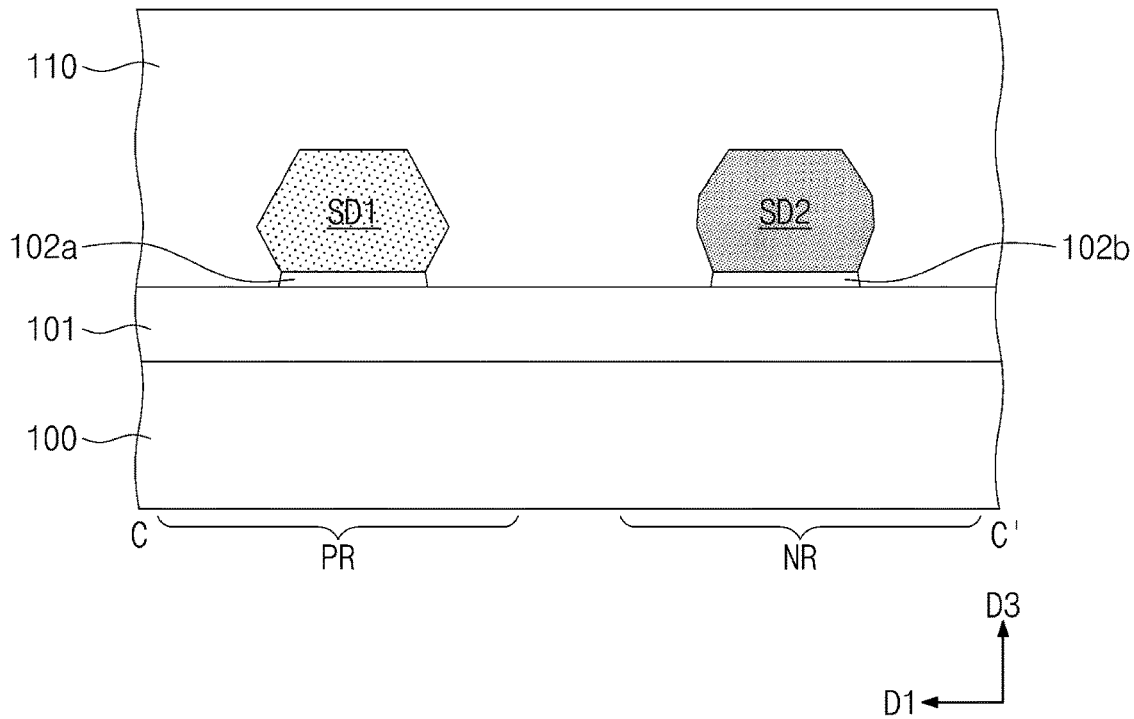
Figure 12D:
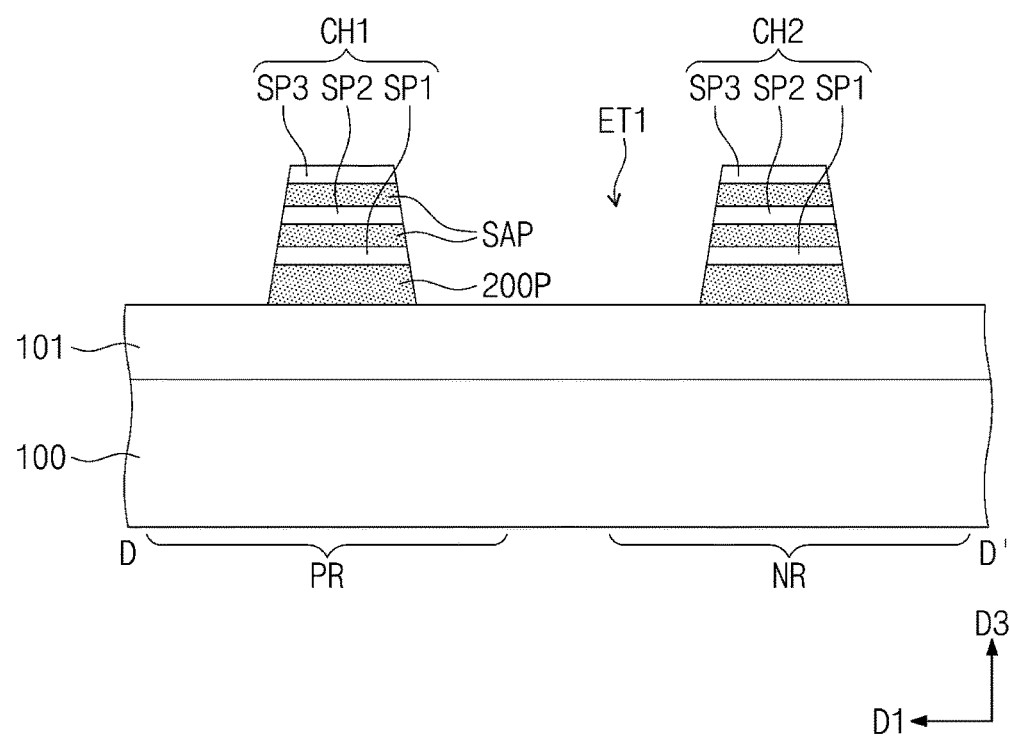

Referring to FIGS. 11A to 11C, first source/drain patterns SD1 may be formed in the first recesses RS1, respectively. Second source/drain patterns SD2 may be formed in the second recesses RS2, respectively. The formation of the first source/drain patterns SD1 may be performed independently of the formation of the second source/drain patterns SD2. The formation of the first source/drain patterns SD1 and the formation of the second source/drain patterns SD2 may be performed by a selective epitaxial growth (SEG) process. For example, the SEG process may include a chemical vapor deposition (CVD) process or a molecular beam epitaxy (MBE) process.

The formation of the first source/drain patterns SD1 may include performing the SEG process using the first semiconductor pattern 102a and the first to third channel patterns SP1, SP2 and SP3 as a seed layer. In particular, since the first recess RS1 does not expose the insulating layer 101 in the embodiments of the inventive concepts, the first semiconductor pattern 102a may be used as the seed layer. Thus, the first source/drain patterns SD1 may be grown in a [100] direction which is parallel to the third direction D3 and in which crystal generation and crystal growth are advantageous. Stacking faults of the first source/drain patterns SD1 may be reduced when the first source/drain patterns SD1 are grown in the [100] direction.

The first source/drain patterns SD1 may be formed of a material capable of providing compressive stress to the first channel structures CH1. For example, the first source/drain patterns SD1 may be formed of a semiconductor element (e.g., SiGe) of which a lattice constant is greater than that of a semiconductor element of the first semiconductor pattern 102a. In the SEG process (or after the SEG process), the first source/drain patterns SD1 may be doped with P-type dopants.

The formation of the second source/drain patterns SD2 may include performing the SEG process using the second semiconductor pattern 102b and the first to third channel patterns SP1, SP2 and SP3 on the second semiconductor pattern 102b as a seed layer. For example, the second source/drain patterns SD2 may be formed of the same semiconductor element (e.g., silicon) as the second semiconductor pattern 102b. In the SEG process or after the SEG process, the second source/drain patterns SD2 may be doped with N-type dopants.

Referring to FIGS. 12A to 12D, a first interlayer insulating layer 110 may be formed to cover the first and second source/drain patterns SD1 and SD2, the hard mask patterns MP, and the gate spacers GS. For example, the first interlayer insulating layer 110 may include a silicon oxide layer.

The first interlayer insulating layer 110 may be planarized until top surfaces of the third sacrificial patterns PP are exposed. The planarization process of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the third sacrificial patterns PP and top surfaces of the gate spacers GS. Next, the exposed third sacrificial patterns PP may be selectively removed. First empty spaces ET1 exposing the channel structures CH1 and CH2, the first sacrificial patterns 200P and the second sacrificial patterns SAP may be formed by the removal of the third sacrificial patterns PP (see FIG. 12D).

Figure 13A:
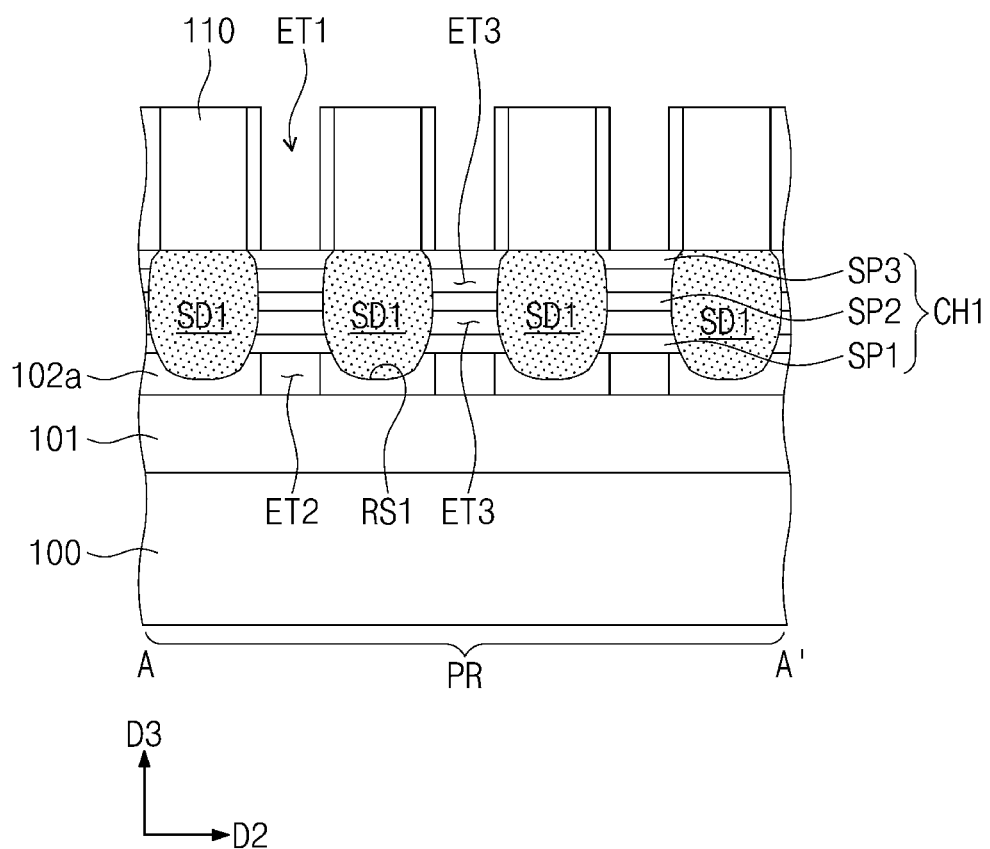
Figure 13B:
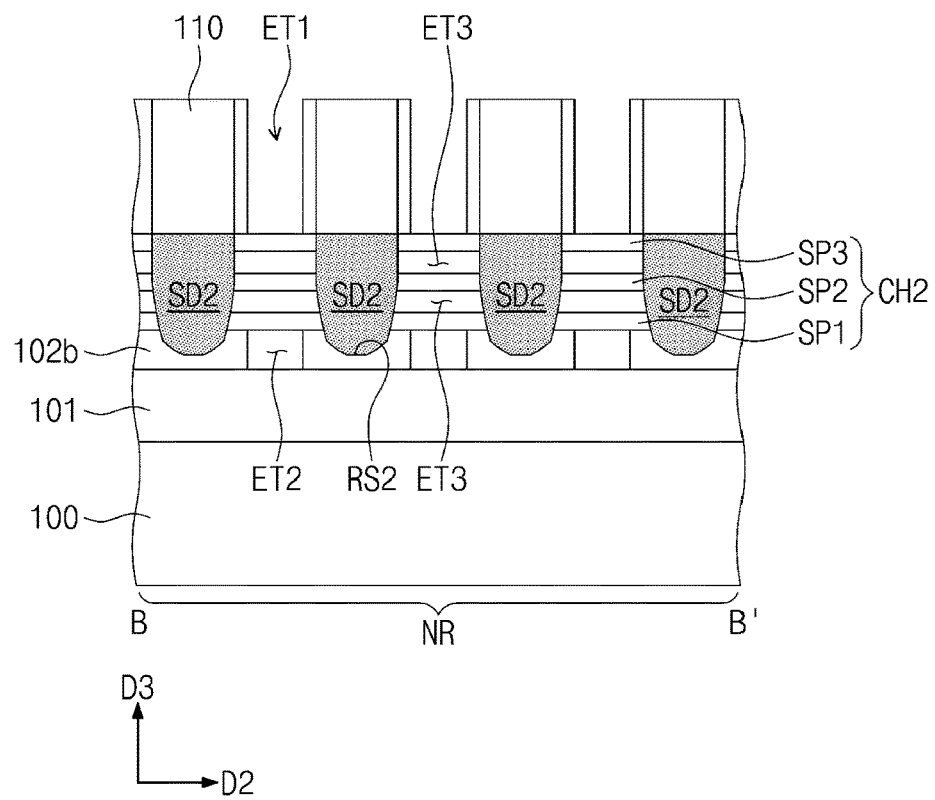
Figure 13C:
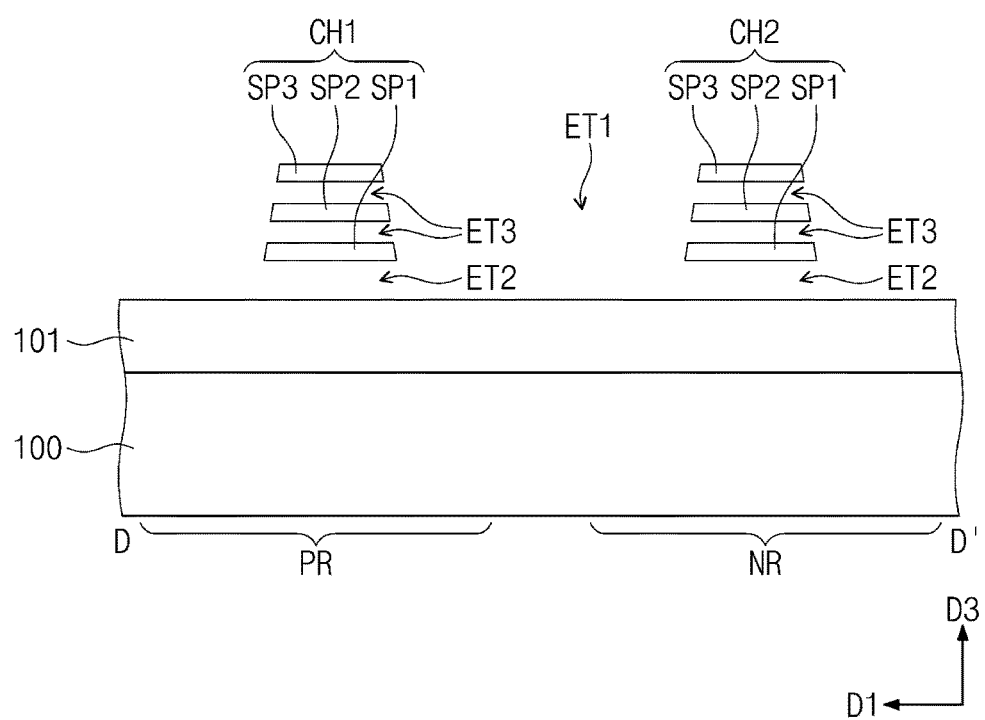

Referring to FIGS. 13A to 13C, the first and second sacrificial patterns 200P and SAP exposed through the first empty space ET1 may be selectively removed. An etching process of selectively etching the first and second sacrificial patterns 200P and SAP may be performed to remove only the first and second sacrificial patterns 200P and SAP while leaving the first to third channel patterns SP1, SP2 and SP3. The etching process may be a wet etching process.

The etching process may have a high etch rate with respect to silicon-germanium having a relatively high germanium concentration. During the removal of the second sacrificial patterns SAP, the low-concentration silicon-germanium layer of the first source/drain pattern SD1 may prevent an etchant from permeating into and etching the high-concentration silicon-germanium layer. The etchant used in the etching process may rapidly remove the first and second sacrificial patterns 200P and SAP having a relatively high germanium concentration but may not remove the most part of the low-concentration silicon-germanium layer of the first source/drain pattern SD1, which has a relatively low germanium concentration. The first and second sacrificial patterns 200P and SAP on the NMOSFET region NR may also be removed during the etching process. Meanwhile, the second source/drain patterns SD2 may contain silicon (Si) without germanium, and thus the second source/drain patterns SD2 may not be removed but may remain during the etching process. Since the first and second sacrificial patterns 200P and SAP are selectively removed, the first to third channel patterns SP1, SP2 and SP3 may remain on each of the first and second semiconductor patterns 102a and 102b.

Second and third empty spaces ET2 and ET3 may be formed by the removal of the first and second sacrificial patterns 200P and SAP, respectively. The second empty space ET2 may be defined between the first channel pattern SP1 and an exposed inner surface of each of the semiconductor patterns 102a and 102b. The third empty spaces ET3 may be defined between the first channel pattern SP1 and the second channel pattern SP2 and between the second channel pattern SP2 and the third channel pattern SP3.

Figure 14A:
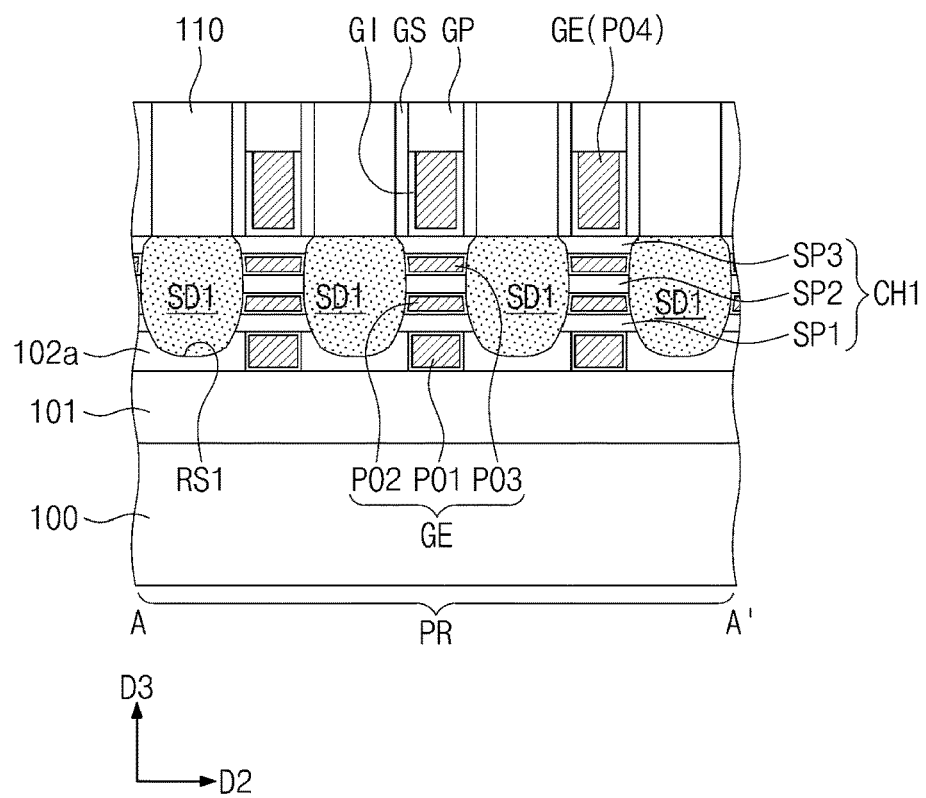
Figure 14B:
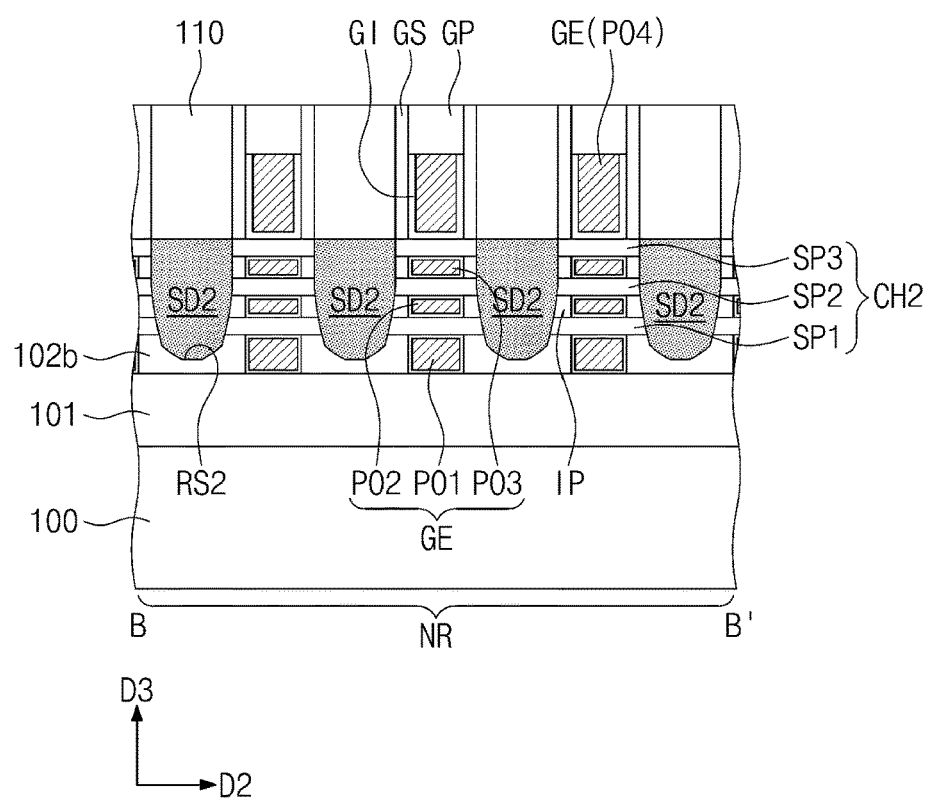
Figure 14C:
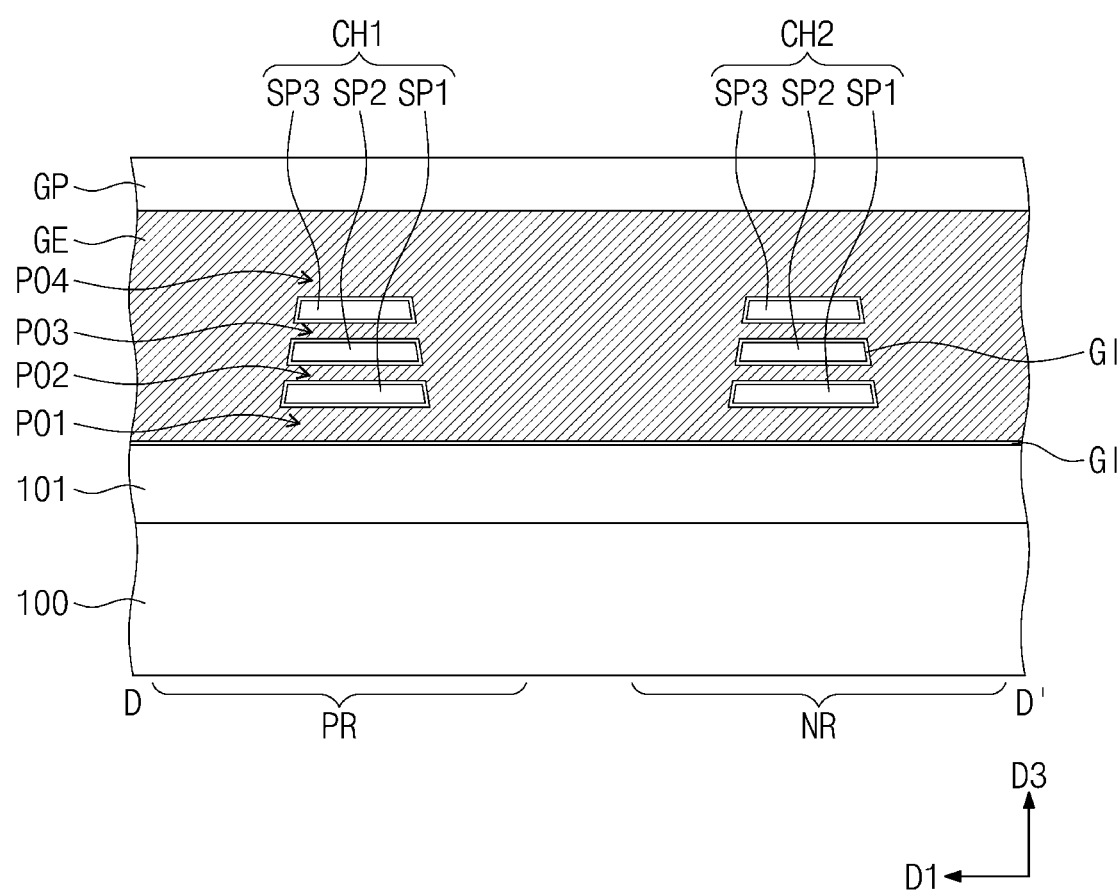

Referring to FIGS. 14A to 14C, a gate insulating layer GI may be conformally formed in the first, second and third empty spaces ET1, ET2 and ET3. For example, an interface layer may be formed on exposed surfaces of the first to third channel patterns SP1, SP2 and SP3 and the exposed inner surfaces of the first and second semiconductor patterns 102a and 102b. The interface layer may be formed by a thermal oxidation process. A high-k dielectric layer may be conformally formed on the interface layer. The high-k dielectric layer may cover the interface layer. The interface layer and the high-k dielectric layer may constitute the gate insulating layer GI.

A gate electrode GE may be formed in the first, second and third empty spaces ET1, ET2 and ET3. The gate electrode GE may include a first portion PO1 filling the second empty space ET2. The gate electrode GE may include second and third portions PO2 and PO3 filling the third empty spaces ET3, respectively. The gate electrode GE may further include a fourth portion PO4 filling the first empty space ET1. A gate capping pattern GP may be formed on the gate electrode GE.

Meanwhile, before the formation of the gate insulating layer GI, insulating patterns IP may be formed on the NMOSFET region NR. The insulating pattern IP may be formed to fill a portion of the third empty space ET3. Thus, the second and third portions PO2 and PO3 of the gate electrode GE on the NMOSFET region NR may be spaced apart from the second source/drain pattern SD2 with the insulating patterns IP interposed therebetween.

Referring again to FIGS. 1 and 2A to 2D, a second interlayer insulating layer 120 may be formed on the first interlayer insulating layer 110. The second interlayer insulating layer 120 may include a silicon oxide layer. Source/drain contacts AC may be formed in the second and first interlayer insulating layers 120 and 110. The source/drain contacts AC may penetrate the second and first interlayer insulating layers 120 and 110 so as to be electrically connected to the first and second source/drain patterns SD1 and SD2. A gate contact GC may be formed. The gate contact GC may penetrate the second interlayer insulating layer 120 and the gate capping pattern GP so as to be electrically connected to the gate electrode GE.

A third interlayer insulating layer 130 may be formed on the source/drain contacts AC, the gate contacts GC and the second interlayer insulating layer 120. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Figure 15A:
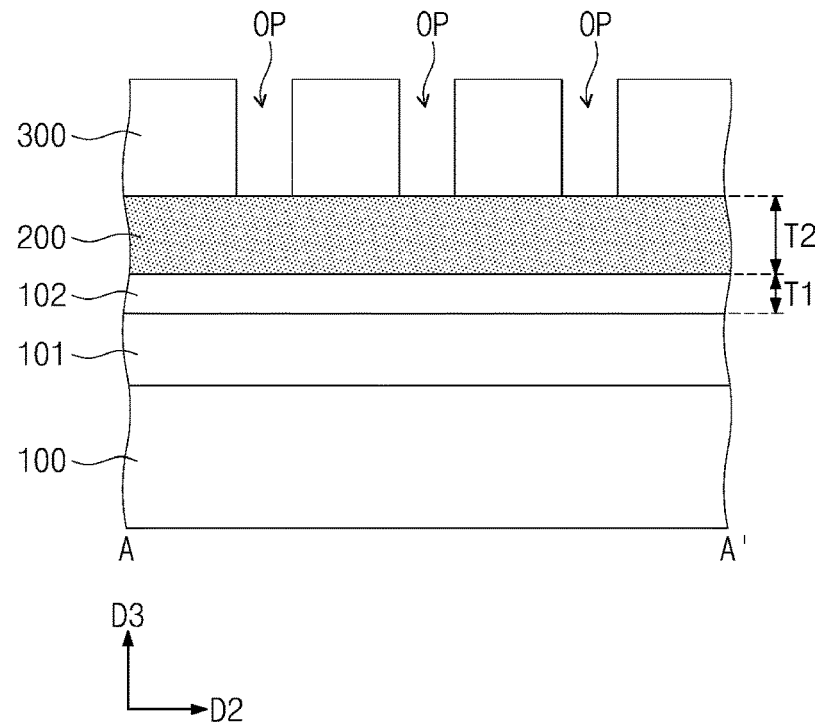
FIGS. 15A to 15C are cross-sectional views illustrating a method of forming sacrificial lines of FIG. 6A, according to some embodiments of the inventive concepts.
Figure 15B:
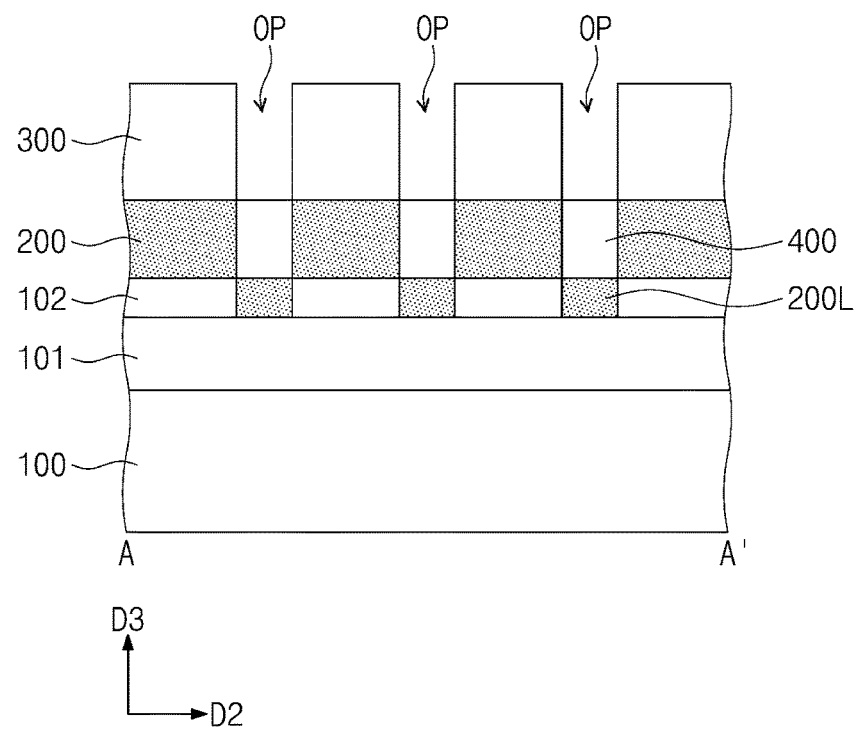
Figure 15C:
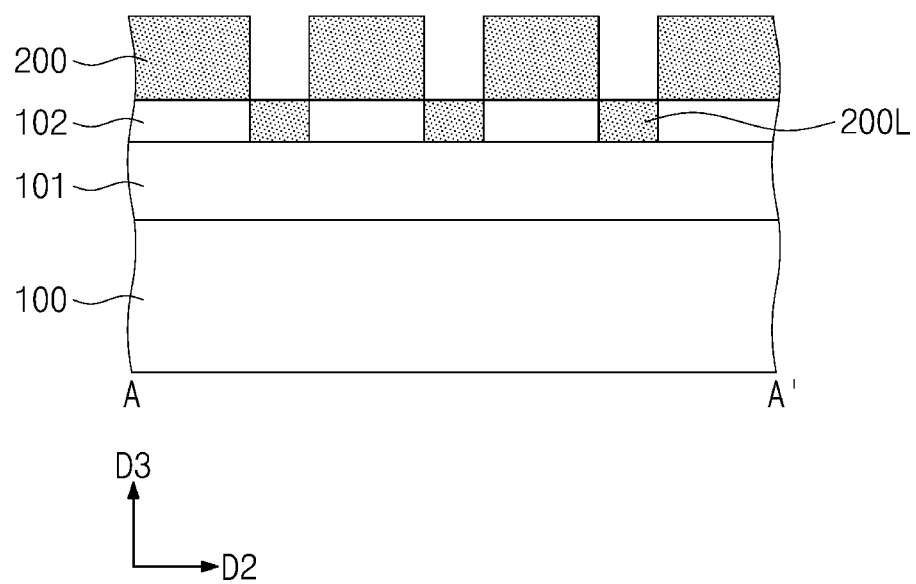

FIGS. 15A to 15C are cross-sectional views illustrating a method of forming the sacrificial lines 200L in the semiconductor layer 102 of FIG. 6A. FIGS. 15A to 15C are cross-sectional views corresponding to the line A-A' of FIG. 1. Referring to FIG. 15A, a support substrate 100, an insulating layer 101 on the support substrate 100, and a semiconductor layer 102 on the insulating layer 101 may be provided. The semiconductor layer 102 may be, for example, silicon on an insulator (SOI). A thickness T1 of the semiconductor layer 102 may be related to the thickness of the first portion PO1 of the gate electrode GE described above.

In other words, when the thickness T1 of the semiconductor layer 102 is greater than a thickness of each of the sacrificial layers SAL of FIG. 7A, the thickness of the first portion PO1 may be greater than the thicknesses of the second and third portions PO2 and PO3 (see FIGS. 3A, 3B, 4A and 4B). When the thickness T1 of the semiconductor layer 102 is less than the thickness of each of the sacrificial layers SAL of FIG. 7A, the thickness of the first portion PO1 may be less than the thicknesses of the second and third portions PO2 and PO3 (see FIGS. 5A and 5B).

A sacrificial semiconductor layer 200 may be formed on the semiconductor layer 102. The sacrificial semiconductor layer 200 may be a silicon-germanium (SiGe) layer. A thickness T2 of the sacrificial semiconductor layer 200 may be greater than the thickness T1 of the semiconductor layer 102.

Mask patterns 300 may be formed on the sacrificial semiconductor layer 200. The mask patterns 300 may have line shapes extending in the first direction D1. The mask patterns 300 may be spaced apart from each other in the second direction D2 to define openings OP therebetween. The mask patterns 300 may include, for example, silicon nitride. The mask patterns 300 may be formed by, for example, a double patterning process. The width of the first portion PO1 of the gate electrode GE may be determined depending on a width of the opening OP in the second direction D2.

Referring to FIG. 15B, oxygen may be injected into exposed portions of the sacrificial semiconductor layer 200 through the openings OP in a thermal treatment process performed at a high temperature. In this process, silicon of the semiconductor layer 102 may be diffused into the sacrificial semiconductor layer 200, and germanium of the sacrificial semiconductor layer 200 may be diffused into the semiconductor layer 102. In the sacrificial semiconductor layer 200, silicon may react with oxygen to form a silicon oxide pattern 400 corresponding to the opening OP. A sacrificial line 200L corresponding to the opening OP may be formed in the semiconductor layer 102. The sacrificial line 200L may include germanium or silicon-germanium. The amount of germanium per unit volume in the sacrificial line 200L may be greater than the amount of germanium per unit volume in the sacrificial semiconductor layer 200 (Ge condensation).

Referring to FIG. 15C, the silicon oxide patterns 400 may be selectively removed by, for example, a wet etching process. Next, the mask patterns 300 may be removed by, for example, a strip process. Referring again to FIG. 6A, the sacrificial semiconductor layer 200 may be removed. The sacrificial semiconductor layer 200 may be removed by, for example, a planarization process (e.g., a CMP process). As a result, top surfaces of the sacrificial lines 200L and a top surface of the semiconductor layer 102 may be exposed.

Figure 16A:
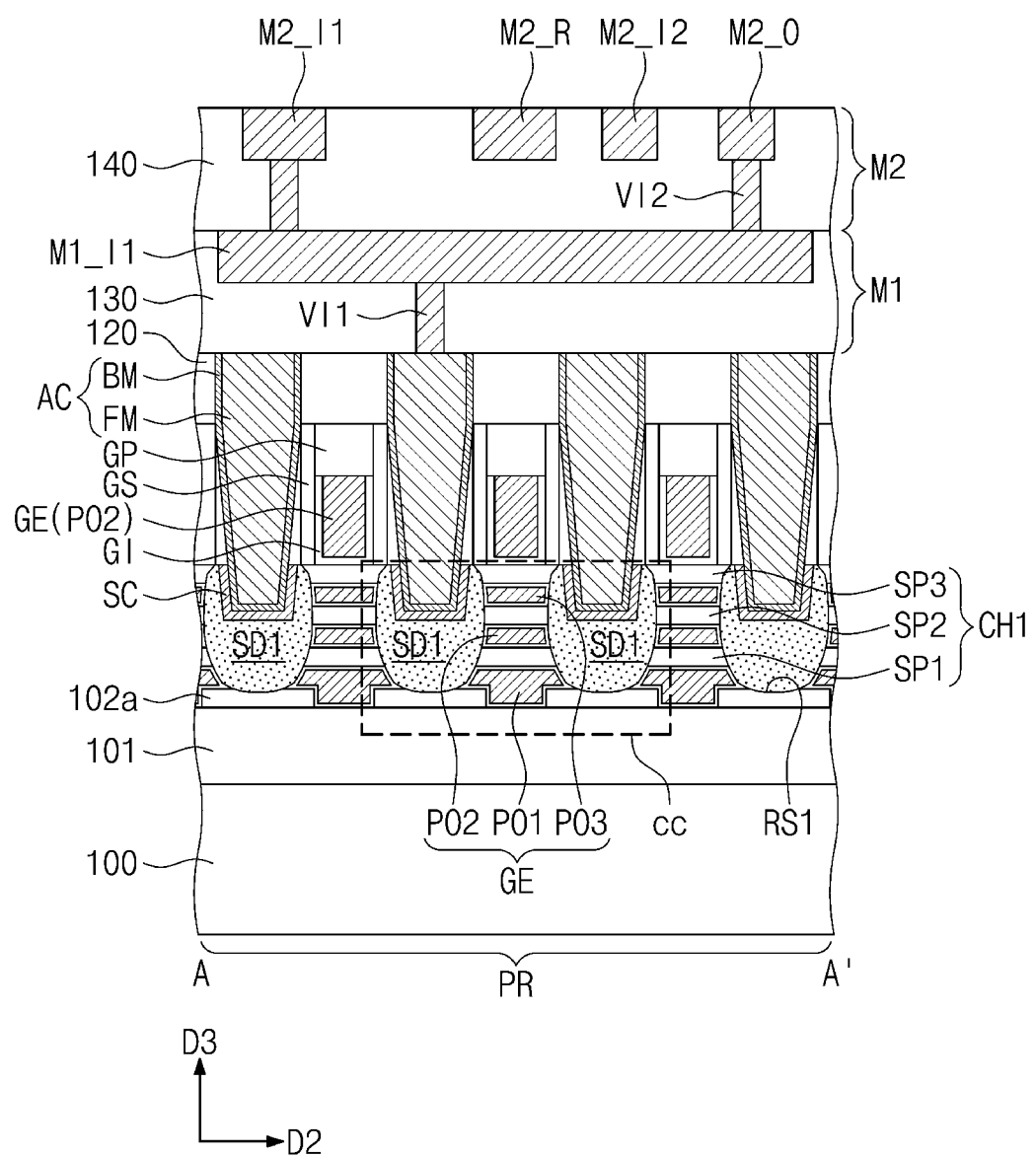
FIGS. 16A and 16B are cross-sectional views taken along the lines A-A' and B-B' of FIG. 1, respectively, to illustrate a semiconductor device according to some embodiments of the inventive concepts.
Figure 16B:
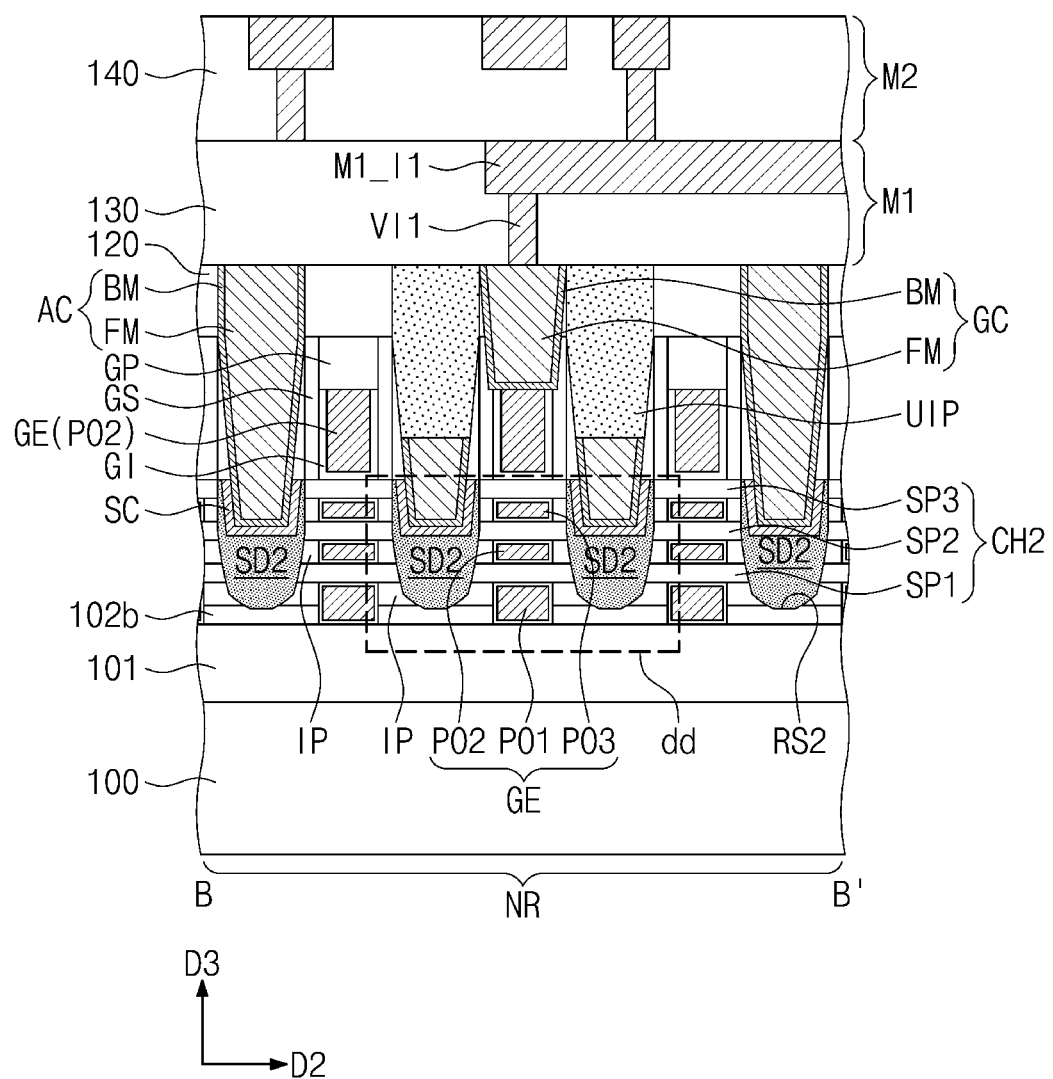
Figure 17A:
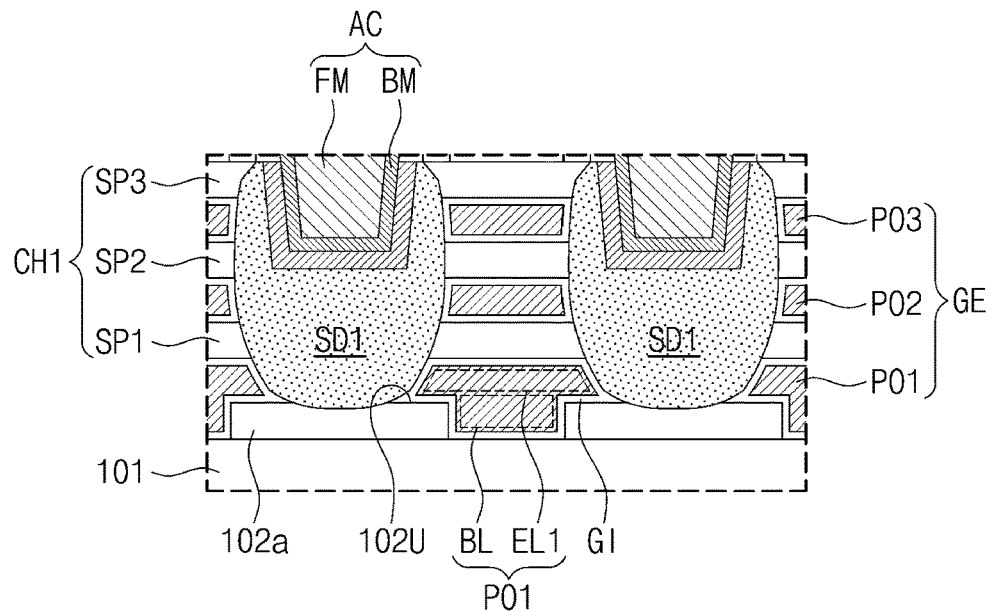
FIG. 17A is an enlarged view of a portion 'cc' of FIG. 16A.
Figure 17B:
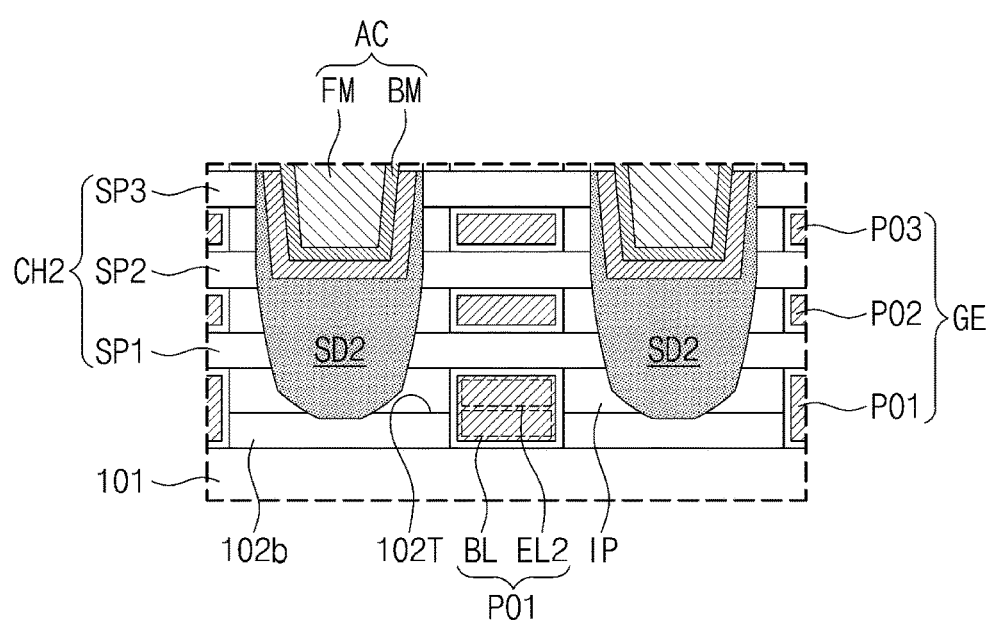
FIG. 17B is an enlarged view of a portion 'dd' of FIG. 16B.

FIGS. 16A and 16B are cross-sectional views taken along the lines A-A' and B-B' of FIG. 1, respectively, to illustrate a semiconductor device according to some embodiments of the inventive concepts. FIG. 17A is an enlarged view of a portion 'cc' of FIG. 16A. FIG. 17B is an enlarged view of a portion 'dd' of FIG. 16B. Hereinafter, the descriptions to the same features as in the embodiments of FIGS. 2A to 2D will be omitted for the purpose of ease and convenience in explanation.

Referring to FIGS. 16A and 17A, a first portion PO1 of the gate electrode GE on the PMOSFET region PR may further include a first extension EL1 extending along a top surface 102U of the first semiconductor pattern 102a. In other words, the first portion PO1 of the gate electrode GE may include a lower portion BL disposed in the first semiconductor pattern 102a, and the first extension EL1 provided on the top surface 102U of the first semiconductor pattern 102a. A width of the first extension EL1 in the second direction D2 may be greater than a width of the lower portion BL in the second direction D2.

The first extension EU may be disposed between the first source/drain patterns SD1. The gate insulating layer GI covering the first extension EL1 may be in contact with the first source/drain pattern SD1. An edge portion of the first extension EL1 may be vertically spaced apart from the insulating layer 101 with the first semiconductor pattern 102a interposed therebetween.

Referring to FIGS. 16B and 17B, a first portion PO1 of the gate electrode GE on the NMOSFET region NR may further include a second extension EL2 protruding from a top surface 102T of the second semiconductor pattern 102b. In other words, the first portion PO1 of the gate electrode GE may include a lower portion BL disposed in the second semiconductor pattern 102b, and the second extension EL2 protruding from the top surface 102T of the second semiconductor pattern 102b. The second extension EL2 may be disposed between the second source/drain patterns SD2. Insulating patterns IP may be disposed between the second extension EL2 and the second source/drain patterns SD2.

The structures of the embodiments of FIGS. 16A, 16B, 17A and 17B may be formed when the sacrificial layer SAL is additionally formed on the semiconductor layer 102 before the formation of the lowermost active layer ACL1 in FIGS. 7A to 7C. In this case, the second sacrificial pattern SAP may be formed directly on the first sacrificial pattern 200P in FIGS. 12A and 12B, and thus the shape of the second empty space ET2 in FIGS. 13A and 13B may be changed.

Figure 18A:
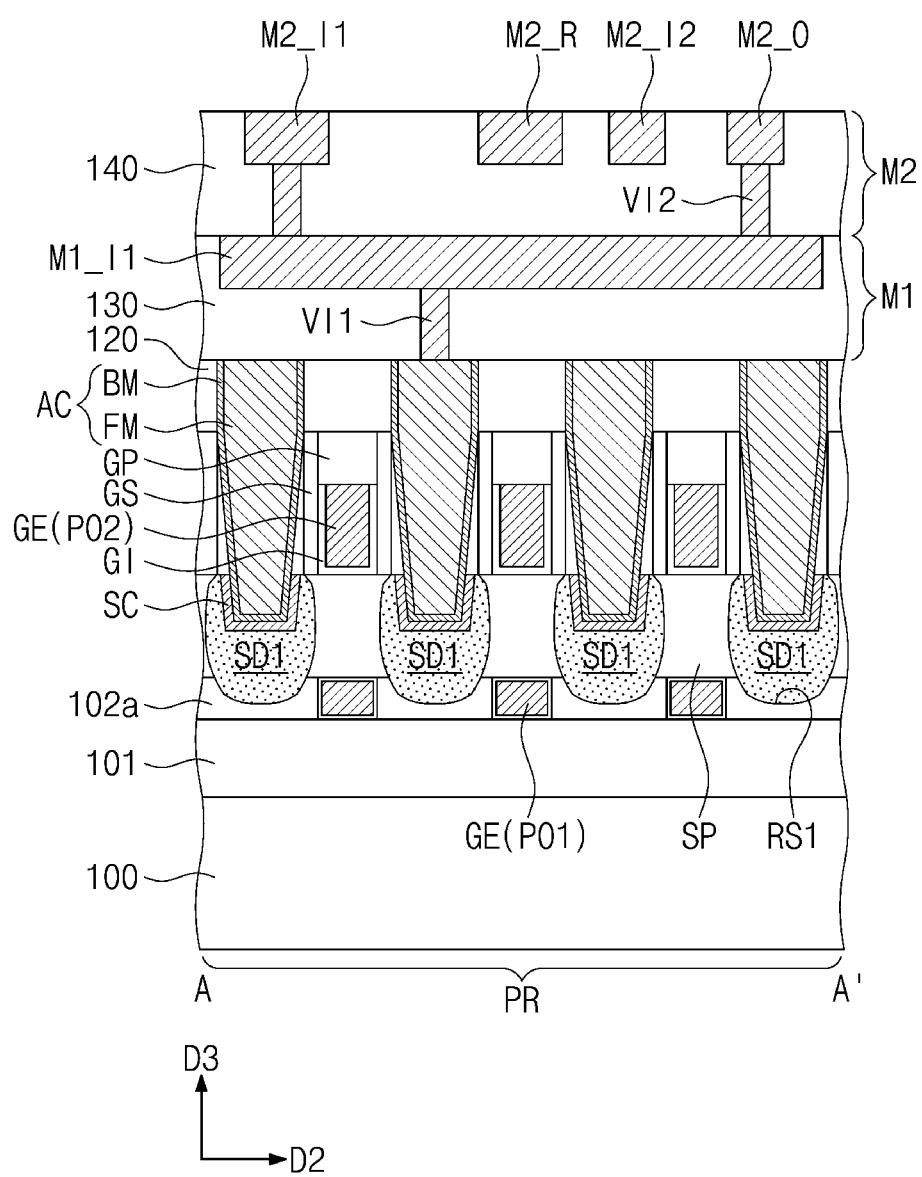
FIGS. 18A, 18B and 18C are cross-sectional views taken along the lines A-A', B-B' and D-D' of FIG. 1, respectively, to illustrate a semiconductor device according to some embodiments of the inventive concepts.
Figure 18B:
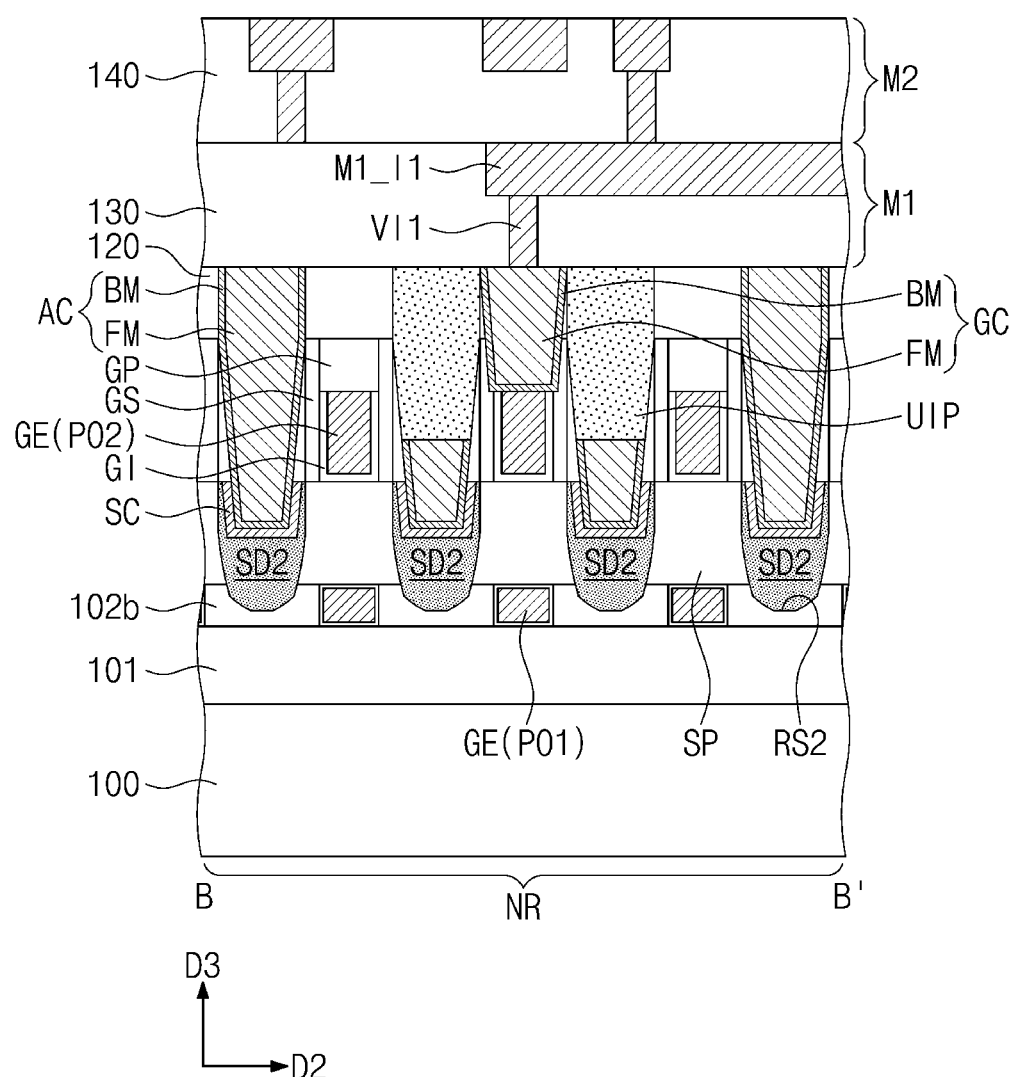
Figure 18C:
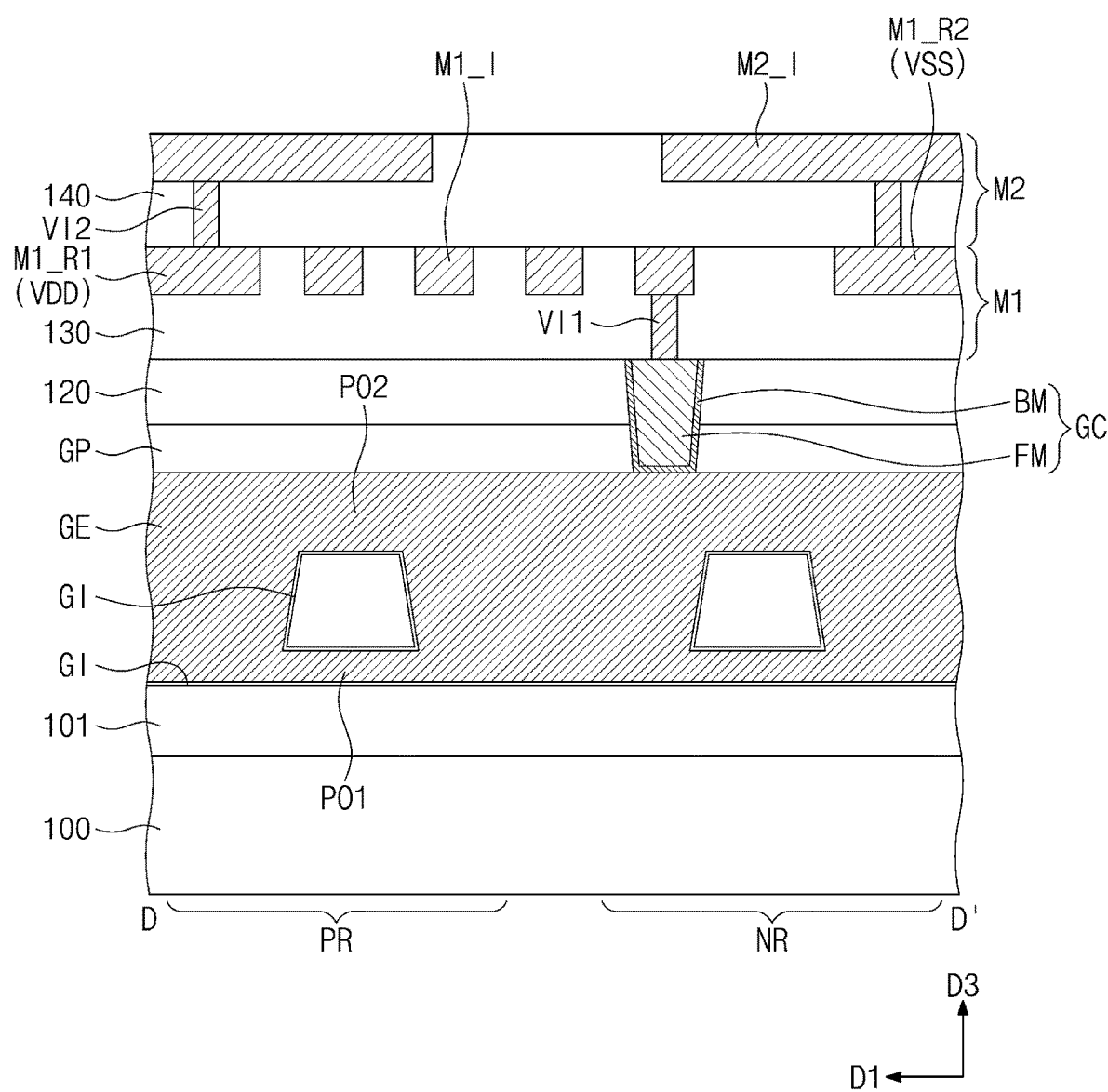

FIGS. 18A, 18B and 18C are cross-sectional views taken along the lines A-A', B-B' and D-D' of FIG. 1, respectively, to illustrate a semiconductor device according to some embodiments of the inventive concepts. Hereinafter, the descriptions to the same features as in the embodiments of FIGS. 2A to 2D will be omitted for the purpose of ease and convenience in explanation.

Referring to FIGS. 18A to 18C, each of first and second channel structures according to the present embodiments may include a single channel pattern SP. A thickness of the channel pattern SP may be greater than a thickness of a first portion PO1 of the gate electrode GE. The gate electrode GE may include the first portion PO1 disposed between the insulating layer 101 and the channel pattern SP, and a second portion PO2 on the channel pattern SP. The gate electrode GE may surround four surfaces of the single channel pattern SP to form a gate-all-around structure.

Referring to FIGS. 7A to 7C, instead of alternately forming the active layers ACL and the sacrificial layers SAL on the semiconductor layer 102, a single active layer ACL may be grown to a level corresponding to a top surface of the uppermost active layer ACL. Subsequent processes may be similar to the processes described above with reference to FIGS. 8A to 14C.

The semiconductor device according to the inventive concepts may be manufactured using the silicon-on-insulator (SOI) substrate, and thus the gate electrode may be disposed directly on the buried insulating layer. In this case, a channel may not be formed under the lowermost portion of the gate electrode, and thus it is possible to prevent occurrence of a leakage current by fine patterns. In addition, the source/drain pattern may be spaced apart from the buried insulating layer, and thus stacking faults in formation of the source/drain pattern may be reduced or minimized to improve reliability and electrical characteristics of the semiconductor device.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device, comprising:
    an electrically insulating layer;
    a semiconductor pattern extending on and contacting the electrically insulating layer;
    a pair of source/drain patterns extending into the semiconductor pattern;
    a channel structure extending between the pair of source/drain patterns, said channel structure comprising a stack of channel patterns, which are spaced apart from each other; and
    a gate electrode extending in spaces between the channel patterns, said gate electrode including a first gate portion, which extends between the channel structure and the electrically insulating layer and has a bottom surface extending closer to the electrically insulating layer relative to a bottommost surface of each of the pair of source/drain patterns.

2. The device of claim 1, wherein the bottommost surface of each of the pair of source/drain patterns extends closer to the electrically insulating layer relative to a bottommost surface of the channel structure.

3. The device of claim 1, wherein the bottommost surface of each of the pair of source/drain patterns extends closer to the electrically insulating layer relative to an uppermost surface of the first gate portion.

4. The device of claim 1, wherein the first gate portion is separated from the channel structure by a gate insulating layer, which surrounds at least a portion of the first gate portion and contacts the electrically insulating layer.

5. The device of claim 1, wherein the stack of channel patterns includes a first channel pattern and a second channel pattern; wherein the first gate portion extends between the electrically insulating layer and the first channel pattern; and wherein the gate electrode further includes a second gate portion extending between the first channel pattern and the second channel pattern.

6. The device of claim 1, wherein the pair of source/drain patterns form respective heterojunctions with the semiconductor pattern.

7. The device of claim 6, wherein the pair of source/drain patterns comprise SiGe; and wherein the semiconductor pattern comprises monocrystalline silicon (Si).

8. The device of claim 1, wherein the electrically insulating layer extends on a semiconductor substrate; and wherein the semiconductor pattern, the electrically insulating layer and the semiconductor substrate collectively define a semiconductor-on-insulator (SOI) substrate.

9. A semiconductor device comprising:
    a support substrate;
    an insulating layer on the support substrate;
    a semiconductor pattern on the insulating layer, the semiconductor pattern being in contact with the insulating layer;
    a pair of source/drain patterns on the semiconductor pattern;
    a channel structure disposed between the pair of source/drain patterns, the channel structure comprising channel patterns stacked and spaced apart from each other; and
    a gate electrode intersecting the channel structure and extending in a first direction,
    wherein the gate electrode includes a first portion disposed between the channel structure and the insulating layer, and
    wherein a level of a bottom surface of the first portion is lower than levels of bottommost surfaces of the source/drain patterns.

10. The semiconductor device of claim 9, wherein the levels of the bottommost surfaces of the source/drain patterns are lower than a level of a bottommost surface of the channel structure.

11. The semiconductor device of claim 9, further comprising:
    a gate insulating layer between the gate electrode and the channel structure,
    wherein the gate insulating layer is in contact with the insulating layer.

12. The semiconductor device of claim 9, wherein the channel patterns include a first channel pattern and a second channel pattern which are sequentially stacked,
    wherein the first portion is disposed between the insulating layer and the first channel pattern,
    wherein the gate electrode further includes a second portion disposed between the first channel pattern and the second channel pattern,
    wherein the first portion of the gate electrode is located under a lowermost one of the channel patterns, and
    wherein the first portion of the gate electrode penetrates the semiconductor pattern.

13. The semiconductor device of claim 12, wherein the bottommost surface of the source/drain pattern is located at a level between a top surface of the first portion and the bottom surface of the first portion.

14. The semiconductor device of claim 12, wherein a thickness of the first portion is greater than a thickness of the second portion.

15. The semiconductor device of claim 14, wherein the thickness of the first portion ranges from 200% to 300% of the thickness of the second portion.

16. The semiconductor device of claim 12, wherein a width of the first portion in a horizontal direction becomes greater from the insulating layer toward the first channel pattern.

17. The semiconductor device of claim 12, wherein a thickness of the first portion is less than a thickness of the second portion.

18. The semiconductor device of claim 12, wherein the first portion further includes an extension extending onto a top surface of the semiconductor pattern and covering the top surface of the semiconductor pattern,
    wherein the extension is disposed between the source/drain patterns, and
    wherein a portion of the extension, which is adjacent to the source/drain pattern, is spaced apart from the insulating layer with the semiconductor pattern interposed therebetween.

19. A semiconductor device comprising:
a support substrate;
an insulating layer on the support substrate;
a semiconductor pattern provided on the insulating layer and being in contact with the insulating layer;
a pair of source/drain patterns on the semiconductor pattern;
a channel structure disposed between the pair of source/drain patterns, the channel structure comprising at least one channel pattern; and
a gate electrode intersecting the channel structure and extending in a first direction,
wherein the gate electrode includes one portion disposed between the insulating layer and a lowermost portion of the channel structure, and the one portion penetrates the semiconductor pattern,
wherein a lower portion of the source/drain pattern is located in the semiconductor pattern, and
wherein the source/drain pattern is spaced apart from the insulating layer with the semiconductor pattern interposed therebetween.

20. The semiconductor device of claim 19, wherein a distance from the insulating layer to the source/drain pattern is greater than a distance from the insulating layer to the gate electrode.

* * * * *